United States Patent
Petrov

(10) Patent No.: US 10,141,941 B2
(45) Date of Patent: Nov. 27, 2018

(54) DIFFERENTIAL PLL WITH CHARGE PUMP CHOPPING

(71) Applicant: Dmitry Petrov, Ottawa (CA)

(72) Inventor: Dmitry Petrov, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/683,374

(22) Filed: Aug. 22, 2017

(65) Prior Publication Data

US 2018/0191359 A1  Jul. 5, 2018

Related U.S. Application Data

(60) Provisional application No. 62/440,782, filed on Dec. 30, 2016.

(51) Int. Cl.

| H03L 7/08 | (2006.01) |
|---|---|
| H03L 7/089 | (2006.01) |
| H02M 3/07 | (2006.01) |
| H03L 7/093 | (2006.01) |
| H03L 7/099 | (2006.01) |

(52) U.S. Cl.
CPC ............ H03L 7/0891 (2013.01); H02M 3/07 (2013.01); H03L 7/093 (2013.01); H03L 7/099 (2013.01)

(58) Field of Classification Search
CPC ... H03L 7/0895; H03L 7/0896; H03L 7/1072; H03L 7/107; H03L 7/0891; H03L 7/093; H03L 7/099
USPC ........................................ 327/156, 158, 536
See application file for complete search history.

(56) References Cited

U.S. PATENT DOCUMENTS

| 7,053,684 | B1* | 5/2006 | Sen ....................... H03L 7/0896 |
| | | | 327/111 |
| 8,773,184 | B1* | 7/2014 | Petrov ..................... H03L 7/093 |
| | | | 327/148 |
| 2007/0229127 | A1 | 10/2007 | Tirumalai et al. | |
| 2009/0261891 | A1 | 10/2009 | Yeh et al. | |

FOREIGN PATENT DOCUMENTS

CN    101567685 A    10/2009

OTHER PUBLICATIONS

Keaveney, et al., "A 10μs Fast Switching PLL Synthesizer for a GSM/EDGE Base-Station", 2004 IEEE International Solid-State Circuits Conference, Session 10, Cellular Systems and Building Blocks, 10.6, Feb. 17, 2004.

* cited by examiner

*Primary Examiner* — John Poos

(57) ABSTRACT

According to a first example aspect there is provided a charge pump circuit that includes a first chopper circuit configured to switch first and second chopper circuit outputs between first and second chopper circuit inputs at a chopping frequency, wherein successive input signals at the first chopper circuit input are output alternatively at the first and second chopper circuit outputs in successive cycles of the chopping frequency and successive input signals at the second chopper circuit input are output alternatively at the second and first chopper circuit outputs in successive cycles of the chopping frequency. A differential charge pump is configured to receive the signals output from the first and second chopper circuit outputs and produce corresponding first and second charge pumped signals.

20 Claims, 15 Drawing Sheets

1300 

Intake Chopper:
Switch successive input signals (upp,m) received at first input I1 alternatively between first and second outputs O1, O2 at chopping frequency
Switch successive input signals (dnp,m) at a second input I2 alternatively between the second and first outputs O2, O1 at chopping frequency
1302

Charge Pump:
Charge pump signals from intake chopper to produce corresponding first and second charge pumped signals
1304

Integral Charge Pump Path:
Receive signals (upp,m, dnp,m) from the first and second outputs O1, O2; output corresponding first and second integral charge pumped signals (cpoutip,m and cpoutim,p)
1304A

Proportional Charge Pump Path:
Receive signals (upp,m, dnp,m) from the first and second outputs O1, O2; output corresponding first and second proportional charge pumped signals (cpoutpp,m and cpoutpm,p)
1304B

Output Chopper:
Output the first charge pumped signals alternatively at first and second outputs in successive cycles of the chopping frequency;
Output the second charge pumped signals alternatively at the second and first outputs in successive cycles of the chopping frequency
1306

Integral Chopper Path:
Switch first and second integral charge pumped signals (cpoutip,m and cpoutim,p) between first and second integral path chopping circuit outputs
1306A

Proportional Chopper Path:
Switch first and second proportional charge pumped signals (cpoutpp,m and cpoutpm,p) between first and second proportional path chopping circuit outputs
1306B

*FIG. 13*

DIFFERENTIAL PLL WITH CHARGE PUMP CHOPPING

RELATED APPLICATIONS

This application claims the benefit of and priority to U.S. provisional patent application Ser. No. 62/440,782, filed Dec. 30, 2016, the contents of which are incorporated herein by reference.

BACKGROUND

A phase of the output signal may be related to a phase of an input reference signal. A PLL circuit may comprise a phase frequency detector (PFD), a charge pump (CP), a loop filter, and a voltage-controlled oscillator (VCO). In use, the PFD may compare the phase of the input reference signal with the phase of a signal derived from an output of the VCO. The PLL may adjust the frequency of its oscillator output to keep the two phases matched. To form a PLL circuit, the PFD may generate an output representing an error between the input reference and the oscillator. The error signal may be fed to the loop filter, which may integrate the signal to smooth it. Then, the smoothed signal may be fed into the VCO, which may generate an output signal with a frequency that is proportional to the smoothed signal (e.g., a tuning voltage signal). The VCO output may also be fed back to the PFD to complete the loop structure of the PLL.

Frequency is a time derivative of phase. Keeping the input and output phase in a locked state may imply keeping the input and output frequencies in a locked state. Consequently, a phase-locked loop may track an input frequency, or it may generate a frequency that is a multiple of the input frequency.

A common application of a PLL is in anlog to digital converter (ADC) applications. Current ADC structures require clocking purity of tenths of femto seconds. Clocking purity can be adversely affected by a number of factors, with three main clocking jitter contributors being charge pump jitter, reference clock jitter and VCO jitter. Accordingly, controlling charge pump noise can be an important aspect of PLL noise reduction. PLL designs that omit a charge pump are possible, including for example designs that use time-to-digital (TDC) circuits and digital filters in the place of charge pumps. However, such charge pump-less circuits tend to occupy the low end of the PLL performance spectrum and require high precision and high current TDC circuits to improve performance.

Accordingly, an improved charge pump configuration for use in a PLL is desired.

SUMMARY

According to a first aspect, there is provided a charge pump circuit that includes an intake chopper circuit, a differential charge pump, and an output chopper circuit. The intake chopper circuit is configured to switch input signals received at first and second inputs of the intake chopper circuit between first and second outputs of the intake chopper circuit at a chopping frequency, wherein successive input signals at the first input are provided alternatively at the first and second outputs in successive cycles of the chopping frequency and successive input signals at the second input are provided alternatively at the second and first outputs in successive cycles of the chopping frequency. The differential charge pump is configured to receive the signals output from the first and second outputs and produce corresponding first and second charge pumped signals. The output chopper circuit is configured to receive the first and second charge pumped signals at respective first and second inputs, provide the first charge pumped signals alternatively at first and second outputs in successive cycles of the chopping frequency, and provide the second charge pumped signals alternatively at the second and first outputs in successive cycles of the chopping frequency.

In some example configurations, the differential charge pump includes: (i) an integral charge pump path configured to receive signals from the first and second outputs of the intake chopper circuit and provide corresponding first and second integral charge pumped signals as the first and second charge pumped signals; and (ii) a proportional charge pump path configured to receive signals from the first and second outputs of the intake chopper circuit and output corresponding first and second proportional charge pumped signals. Furthermore, the output chopper circuit includes: (i) an integral path chopper circuit configured to switch the first and second integral charge pumped signals between first and second integral path chopping circuit outputs at the chopping frequency; and (ii) a proportional path chopper circuit configured to switch the first and second proportional charge pumped signals between first and second proportional path chopping circuit outputs at the chopping frequency. In examples, the chopping frequency is greater than a corner frequency of current flicker noise introduced by the integral and proportional charge pump paths.

In some configurations of the charge pump circuit, the first input of the intake chopper circuit receives successive pull-up signals from a phase frequency detector and the second input of the intake chopper circuit receives successive pull-down signals from the phase frequency detector, the first and second outputs of the intake chopper circuit generating first and second output signals that each comprise alternating pull-up and pull-down signals.

In some example configurations, in successive cycles of the chopping frequency: the integral path chopper circuit receives alternating positive and negative integral charge pumped signals at a first input and alternating negative and positive integral charge pumped signals at a second input, and outputs successive positive integral charge pumped signals at a first output and outputs successive negative integral charge pumped signals at a second output; and the proportional path chopper circuit receives alternating positive and negative proportional charge pumped signals at a first input and alternating negative and positive proportional charge pumped signals at a second input, and outputs successive positive proportional charge pumped signals at a first output and outputs successive negative proportional charge pumped signals at a second output.

In one or more of the above examples of the charge pump circuit, the intake charge pump, integral charge pump path and proportional charge pump path each comprise a butterfly switch circuit configured to switch a pair of inputs between a pair of outputs at the chopping frequency. In some configurations, the proportional charge pump path is an N scaled replica of the integral charge pump path where $10<=N<=40$. In some examples, the output chopper circuit up-converts flicker noise introduced by the differential charge pump path to the chopping frequency, the chopping frequency being selected to exceed a corner frequency of the flicker noise.

According to a second aspect of the present disclosure, a method of applying charge pumping signals is described. The method includes: at an intake chopper, switching successive input signals received at a first input alternatively between first and second outputs in successive cycles of a chopping frequency and switching successive input signals at a second input alternatively between the second and first outputs in the successive cycles; charge pumping the signals output from the first and second outputs to produce corresponding first and second charge pumped signals; and at an output chopper, receiving the first and second charge pumped signals at respective first and second inputs, outputting the first charge pumped signals alternatively at first and second outputs in successive cycles of the chopping frequency, and outputting the second charge pumped signals alternatively at the second and first outputs in successive cycles of the chopping frequency.

In example embodiments, the switching at the intake chopper up-converts the input signals to the chopping frequency, and the switching at the output chopper: (i) down-converts a spectrum of the first and second charge pumped signals corresponding to the spectrum of the input signals from the chopping frequency; and (ii) up-converts flicker noise introduced by the charge pumping to the chopping frequency.

In some examples of the method, the charge pumping includes: (i) using an integral charge pump path to receive signals from the first and second outputs of the intake chopper circuit and output corresponding first and second integral charge pumped signals as the first and second charge pumped signals; and (ii) using a proportional charge pump path to receive the signals from the first and second outputs of the intake chopper circuit and output corresponding first and second proportional charge pumped signals. Receiving and outputting at the output chopper comprises: (i) using an integral path chopper circuit to switch the first and second integral charge pumped signals between first and second integral path chopping circuit outputs at the chopping frequency; and (ii) using a proportional path chopper circuit to switch the first and second proportional charge pumped signals between first and second proportional path chopping circuit outputs at the chopping frequency.

In some examples of the method, the chopping frequency is greater than a corner frequency of the flicker noise introduced by the integral and proportional charge pump paths. In some configurations, the first input of the intake chopper receives successive pull-up signals from a phase frequency detector and the second input of the intake chopper receives successive pull-down signals from the phase frequency detector, the first and second outputs of the intake chopper generating first and second output signals that each comprise alternating pull-up and pull-down signals.

In some examples of the method, in successive cycles of the chopping frequency: the integral path chopper circuit receives alternating positive and negative integral charge pumped signals at a first input and alternating negative and positive integral charge pumped signals at a second input, and outputs successive positive integral charge pumped signals at a first output and outputs successive negative integral charge pumped signals at a second output; and the proportional path chopper circuit receives alternating positive and negative proportional charge pumped signals at a first input and alternating negative and positive proportional charge pumped signals at a second input, and outputs successive positive proportional charge pumped signals at a first output and outputs successive negative proportional charge pumped signals at a second output.

According to another a further example aspect, a phase lock loop (PLL) is provided. The PLL includes an active low pass filter configured to generate one or more tuning signals, and a voltage-controlled oscillator (VCO) coupled to the active low pass filter and configured to generate a feedback signal based on the one or more tuning signals. The PLL also includes a phase frequency detector configured to compare the feedback signal to a reference signal and generate pull up and pull down signals based on the comparison. A charge pump circuit of the PLL includes: an intake chopper circuit configured to modulate the pull up and pull down signals with a chopping frequency; an integral charge pump path configured to receive the modulated pull up and pull down signals and output corresponding positive and negative integral charge pumped signals; an integral path chopper circuit configured to modulate the positive and negative integral charge pumped signals at the chopping frequency; a proportional charge pump path configured to receive the modulated pull up and pull down signals and output corresponding positive and negative proportional charge pumped signals; and a proportional path chopper circuit configured to modulate the positive and negative proportional charge pumped signals at the chopping frequency. The active low pass filter is coupled to the charge pump circuit to receive the positive and negative integral charge pumped signals and the positive and negative proportional charge pumped signals and configured to generate the one or more tuning signals based thereon.

In some examples of the PLL, the intake chopper circuit is configured to switch first and second chopper circuit outputs between first and second chopper circuit inputs at the chopping frequency, wherein successive pull up signals at the intake chopper circuit input are output alternatively at the first and second chopper circuit outputs in successive cycles of the chopping frequency and successive pull down signals at the second chopper circuit input are output alternatively at the second and intake chopper circuit outputs in successive cycles of the chopping frequency.

In some examples of the PLL, the integral path chopper circuit includes first and second inputs and first and second outputs and is configured to switch the first and second outputs between the first and second inputs at the chopping frequency, wherein successive positive and negative integral charge pumped signals at each of the first and second inputs are output alternatively at the first and second outputs with the positive integral charge pumped signals being successively output exclusively at the first output and the negative integral charge pumped signals being successively output exclusively at the second output in successive cycles of the chopping frequency. Furthermore, the proportional path chopper circuit includes first and second inputs and first and second outputs and is configured to switch the first and second outputs between the first and second inputs at the chopping frequency, wherein successive positive and negative proportional charge pumped signals at each of the first and second inputs are output alternatively at the first and second outputs with the positive proportional charge pumped signals being successively output exclusively at the first output and the negative proportional charge pumped signals being successively output exclusively at the second output in successive cycles of the chopping frequency.

In example embodiments of the PLL, the chopping frequency is greater than a corner frequency of current noise introduced by the integral and proportional charge pump paths. The proportional charge pump path can be an N scaled replica of the integral charge pump path where $10 \leq N \leq 40$.

According to a further aspect is a method of controlling a phase lock loop (PLL) having an active low pass filter configured to generate one or more tuning signals; a voltage-controlled oscillator (VCO) coupled to the active low pass filter and configured to generate a feedback signal based on the one or more tuning signals; and a phase frequency detector configured to compare the feedback signal to a reference signal and generate pull up and pull down signals based on the comparison. The method includes: modulating, using an intake chopper circuit, the pull up and pull down signals with a chopping frequency; charge pumping, using an integral charge pump path, the modulated pull up and pull down signals to output corresponding positive and negative integral charge pumped signals; modulating, using an integral path chopper circuit, the positive and negative integral charge pumped signals with the chopping frequency; charge pumping, using a proportional charge pump path, the modulated pull up and pull down signals and output corresponding positive and negative proportional charge pumped signals; modulating, using a proportional path chopping circuit, the positive and negative proportional charge pumped signals with the chopping frequency; and receiving, at the active low pass filter, the positive and negative integral charge pumped signals from the integral path chopper circuit and the positive and negative proportional charge pumped signals from the proportional path chopper circuit, and generating the one or more tuning signals based thereon.

In some examples of the method, modulating, using the intake chopper circuit, comprises switching first and second outputs of the intake chopper circuit between first and second inputs of the intake chopper circuit at the chopping frequency, wherein successive pull up signals at the first input are output alternatively at the first and second outputs in successive cycles of the chopping frequency and successive pull down signals at the second input are output alternatively at the second and first outputs in successive cycles of the chopping frequency.

In some examples of the method, modulating, using the integral path chopper circuit, comprises switching first and second outputs of the integral path chopper circuit between first and second inputs of the integral path chopper circuit at the chopping frequency, wherein successive positive and negative integral charge pumped signals at each of the first and second inputs are output alternatively at the first and second outputs with the positive integral charge pumped signals being successively output exclusively at the first output and the negative integral charge pumped signals being successively output exclusively at the second output in successive cycles of the chopping frequency; and modulating, using the proportional path chopper circuit, comprises switching first and second outputs of the proportional path chopper circuit between first and second inputs of the proportional path chopper circuit at the chopping frequency, wherein successive positive and negative proportional charge pumped signals at each of the first and second inputs are output alternatively at the first and second outputs with the positive proportional charge pumped signals being successively output exclusively at the first output and the negative proportional charge pumped signals being successively output exclusively at the second output in successive cycles of the chopping frequency.

Devices and methods according to the above aspects may, in some applications, enable chopping to be performed in the charge pump that will provide noise reduction in a space and cost efficient manner, which may improve clocking performance in high speed ADC applications, optical applications and other applications. In at least some example embodiments, the components of charge pump circuit can be formed along with all of the other components of a PLL in a single integrated circuit, on-die PLL solution.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 13 illustrates an example embodiment of a charge pumping method;

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
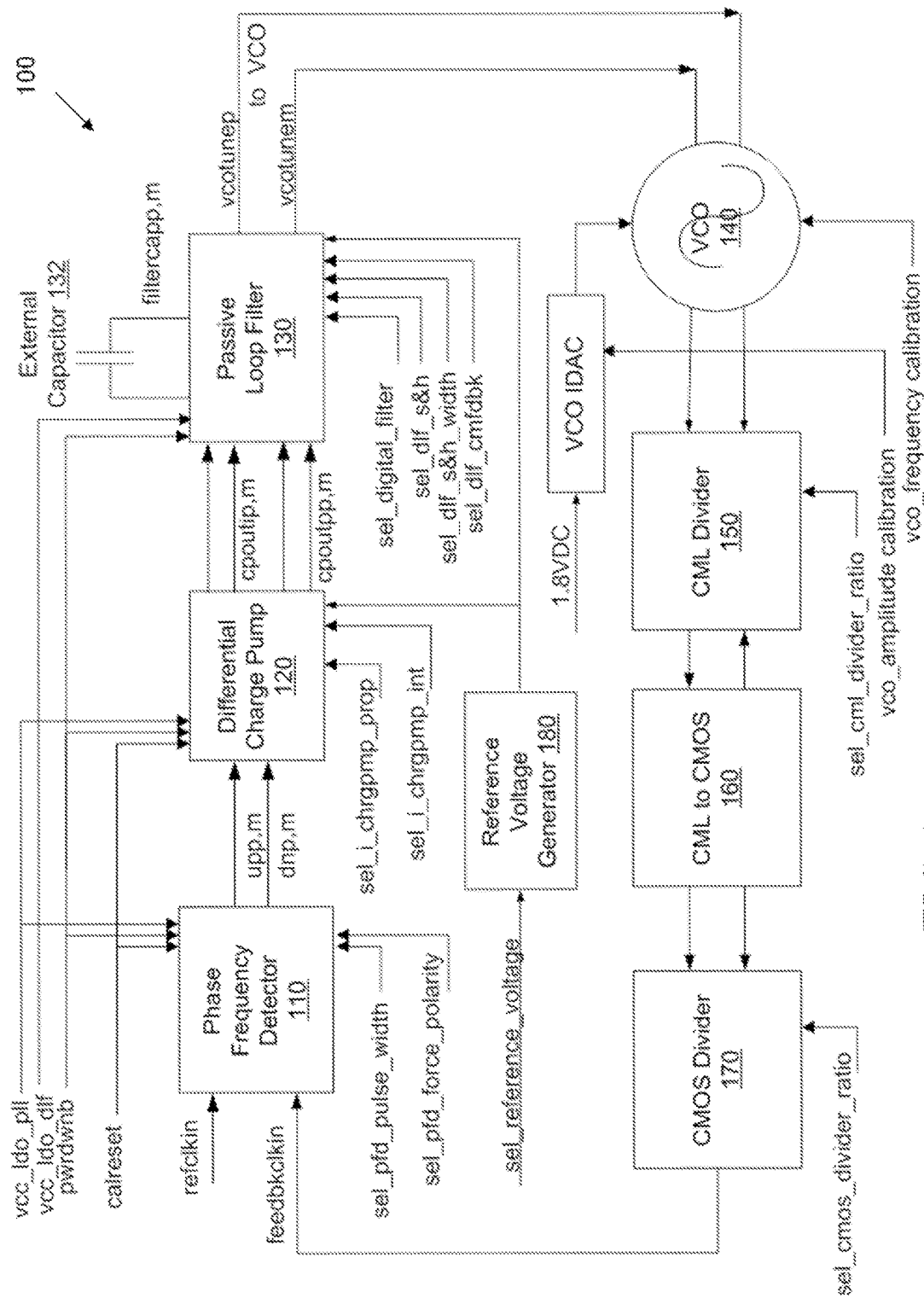
FIG. 1 illustrates a high level schematic diagram of a PLL.

The so-called passive mode may be a conventional PLL utilizing one or more external capacitors to achieve a required loop dynamic. FIG. 1 illustrates a high level schematic diagram of a PLL 100, which may operate in a passive mode. The PLL circuit 100 comprises a control path and a feedback path coupled to the control path. The control path may include a traditional 3-state phase-frequency detector (PFD) 110, a differential charge pump (CP) 120, and a loop filter (LF) 130. The feedback path may include a voltage-controlled oscillator (VCO) 140, a current mode logic (CIVIL) divider 150, a CIVIL to complementary metal-oxide-semiconductor (CMOS) converter 160, and a CMOS divider 170 (sometimes called a VCO edge counter). The CML divider 150 and the CMOS divider 170 may be high frequency dividers.

Signal notations in FIG. 1 may be defined as follows:

Vcc_ldo_pll denotes a direct current (DC) supply voltage (e.g., 0.9-1.1 volts) used to provide power for some modules or units in the PLL 100, such as the PFD 110 and the CP 120;

Vcc_ldo_divider denotes a DC supply voltage (e.g., 0.9-1.1 volts) used to provide power for divider sub-circuits, such as the CIVIL divider 150 and/or the CMOS divider 170;

pwrdwnb denotes an enabling signal (e.g., a high pwrdwnb may power up the loop filter 130 and the CP 120);

calreset denotes a control signal for calibration reset (e.g., a high calreset may set the PLL 100 in a VCO frequency calibration mode, disconnecting the charge pump 120 from the loop filter 130, and shorting "vcotunep" and "vcotunem" to a reference voltage denoted as "vref");

vref denotes a reconfigurable DC reference voltage, which may change +/−20% around half of Vcc_ldo_dlf;

refclkin denotes an input reference clock;

feedbkclkin denotes an input feedback clock;

sel_pfd_pulse width denotes a control signal for pulse width selection for the PFD;

sel_pfd force_polarity denotes a control signal for force polarity selection for the PFD;

upp and upm (sometimes in short as upp, m) denote positive (P) and negative (M) pull-up signals;

dnp and dnm denote positive and negative pull-down signals;

sel_i_chrgpmp_prop denotes a control signal for selection of current level for a proportional path of the CP 120, which may serve as a single main CP in the passive mode;

cpoutpp and cpoutpm denote positive and negative output signals in the proportional path;

filtercapp and filtercapm denote positive and negative outputs to the capacitor that should be connected externally to the chip in PLF case;

vcotunep denotes a positive output signal of the loop filter 130, which is used as a positive control or tuning signal for the VCO 140;

vcotunem denotes a negative output signal of the loop filter 130, which is used as a negative tuning signal for the VCO 140;

sel_cml_divider ratio denotes a control signal for the selection of a divider ratio for the CIVIL divider 150;

sel_cmos_divider ratio denotes a control signal for the selection of a divider ratio for the CMOS divider 170;

vco_amplitude_calibration denotes an amplitude calibration control signal for the VCO 140; and vco_frequency_calibration denotes a frequency calibration control signal for the VCO 140 (e.g., feeding into the VCO 140 through a digital finite state machine (FSM) module. The output of this module is a VCO frequency band setting code);

Note that a signal described herein may be implemented as one or more signals, depending on the application. Notations described regarding one figure such as FIG. 1 may also be applicable to another figure, if the same notation is used.

With the PLL circuit 100 operating in a passive mode, the PFD 110 may feed "up" and "down" pulses (i.e., upp, upm, dnp, and dnm) to the CP 120, which may be a single differential CP. Note the term "feed" used herein may be direct or indirect (e.g., through other components). A width of the pulse signals may be programmable to any suitable value, such as 50, 100, 150, or 200 pico seconds (ps). Further, a current of the CP 120 may also be programmable, e.g., ranging from 320 micro Ampere (uA) to 1600 mini Ampere (mA) in 80 uA steps. Each center tap (not shown in the high level diagram) in the differential CP 120 may be directly coupled or connected to a differential resistor-capacitor (RC) filtering network and to differential control inputs of the VCO 140. Thus, the voltage on the positive or negative CP center tap may be equal to a positive or negative control voltage of the VCO 140. The center tap voltages depend on either process, voltage, and temperature (PVT) or an operational frequency of the PLL 100. It should be noted that either the center tap voltage of the CP 120 or the differential and common mode tuning voltages of the VCO 140 may depend on PVT and float within 400 mV range during operation.

In the PLL 100, a common mode feedback circuitry may be implemented to equate VCO and CP common mode voltages. Center tap common mode voltage of the CP 120 may be sensed by a common mode amplifier and compared to a programmable reference voltage threshold generated by a reference voltage generator 180. The comparison result may be applied as a correctional voltage to a PMOS current source in the CP 120. This correction mechanism may increase the dependency of CP "up" and "down" pulse mismatch on the differential VCO tuning voltages, e.g., the operational frequency and temperature of the VCO 140.

An output clock signal of the VCO 140 may be sent to the CIVIL divider 150. An output of the CIVIL divider 150 may be converted to a CMOS signal by the CIVIL to CMOS converter 160, which may be followed by the programmable CMOS divider 170. The CMOS divider 170 may be controlled by a frequency setting register and produce a divided clock signal. The divided clock signal may be fed back to the PFD 110 to create up and down control signals (i.e., upp, upm, dnp, and dnm signals) for the CP 120.

In use, during initialization or powering up, the VCO 140 may go through frequency and amplitude calibration procedures. The frequency calibration, e.g., using vco_frequency_calibration may lead to an optimal VCO band setting, which may guarantee a differential tuning voltage of no more than 200 mV. Similarly, the amplitude calibration, e.g., using vco_amplitude_calibration, may set a VCO amplitude for optimal phase noise performance. Note that the frequency and/or amplitude calibration of the VCO 140 may have manual override.

The loop filter 130 may be a low pass filter with some nodes connected to center taps of the CP 120, e.g., through an analog multiplexer. The loop filter 130 is a PLF, thus it may comprise passive internal components, including a passive integrator and/or a passive differentiator. The internal components in the loop filter 130 may be integrated and programmable on-chip or on the die. However, the loop filter 130 may need at least one capacitor 132 with a relatively large capacitance (e.g., no less than 1 nanofarad (nF)). The capacitor 132 may need to be implemented outside the die, in other words, as an external capacitor. The external capacitor 132 may not be fabricated using a monolithic process together with internal components on the die. For example, if the external capacitor 132 has a capacitance of 1 nF, it may occupy a space or area of about 250000 square microns, which may be the size of about 7 die bumps. Consequently, additional die bumps and precious board space may be required to mount the external capacitor 132 next to the bumps. Further, the external capacitor 132 may introduce leakage over PVT, which may lower performance of the PLL 100.

Disclosed herein are systems, apparatus, and methods for improving the performance of a PLL by implementing an active operation mode. Compared to the passive mode, the disclosed active mode may require less or no external components (e.g., external capacitor), while achieving necessary loop dynamics. In an embodiment, a loop filter may comprise an active integrator, which may comprise a matched pair of differential operational amplifiers (or a single amplifier performing the same function as the matched pair of amplifiers). Common mode feedback may be added to control differential VCO common mode level. The operation amplifiers used in the loop filter may fix or pin the center tap of a charge pump to a desired reference voltage, which in turn may reduce jitter. Further, the single path CP may be replaced by a CP comprising integral and proportional paths in a differential configuration. A sample and hold (SH) circuit may follow the loop filter, and may be further followed by one or more additional resistor-capacitor (RC) filters. Thus, a tuning voltage feeding into a VCO may be filtered first. The additional filtering may unlock a PLL for 75% of a reference clock period, reducing the noise sensitivity and total jitter. Moreover, to extend PLL lock range over PVT, VCO tuning characteristic may be linearized by utilizing a weighted combination of linear and nonlinear frequency tuning elements in a differential VCO tank. In some cases, usable tuning range may be increased by 25% over PVT.

Figure 2:
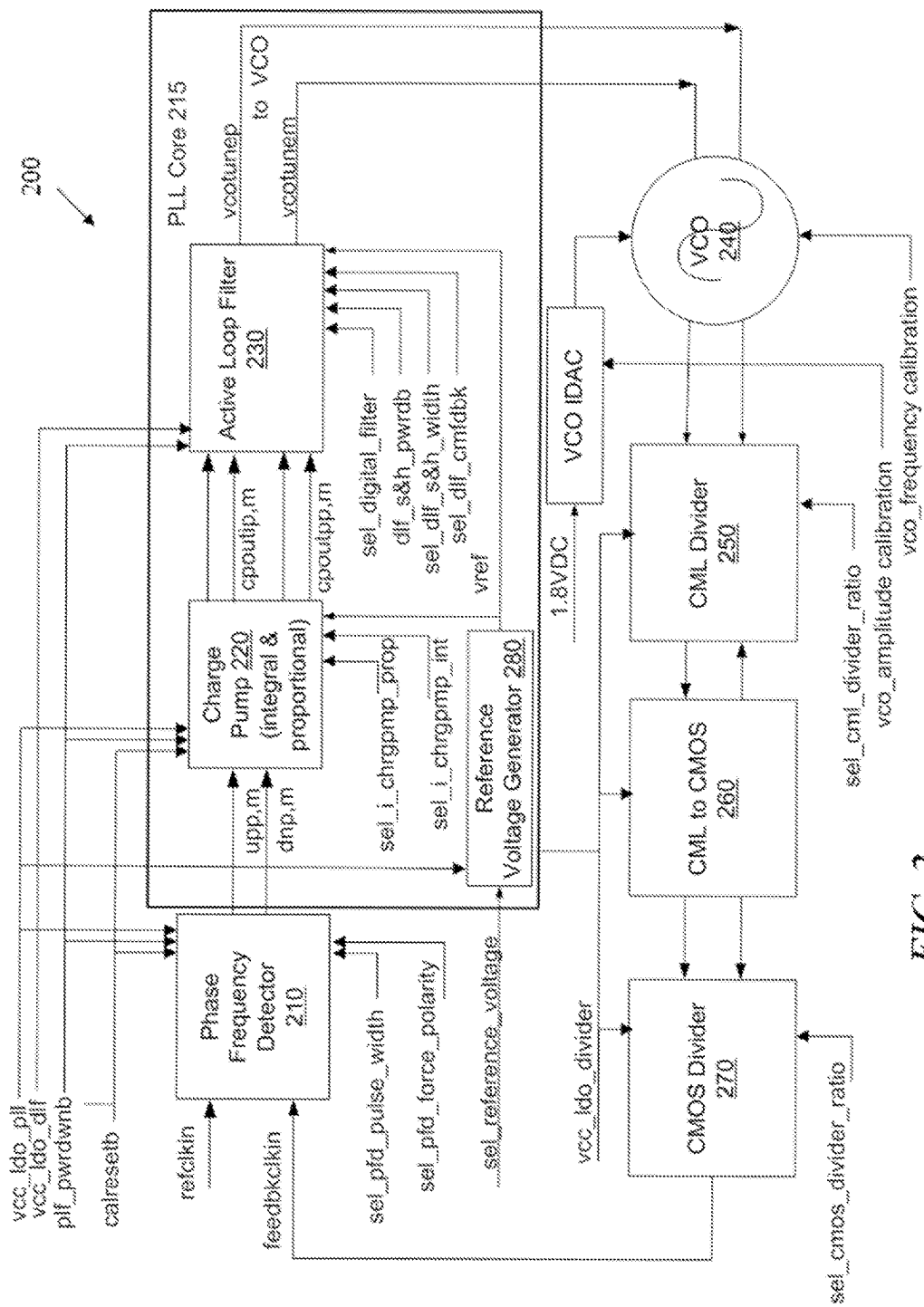
FIG. 2 illustrates a high level schematic diagram of an embodiment of a PLL.

FIG. 2 illustrates a high level schematic diagram of an embodiment of a PLL 200, which may operate in an active mode. Similar to the PLL 100, the PLL 200 may comprise a control path and a feedback path coupled to the control path. The control path may include a PFD 210, a CP 220, and a LF 230. The feedback path may include a VCO 240, a CML divider 250, a CIVIL to CMOS converter 260, and a CMOS divider 270. Note that some aspects of the PLL 200 may be the same with or similar to the PLL 100, thus in the interest of conciseness the following descriptions may focus on differences between the two. A person of ordinary skill in the art will understand common functionalities applicable to both operational modes.

Note that some of the signal notations in FIG. 2 may be defined as follows:

Vcc_Ido_dlf denotes a DC supply voltage used for the loop filter 230;

sel_i_chrgpmp_prop denotes a control signal for selection of current level for a proportional path of the charge pump 220;

sel_i_chrgpmp_int denotes a control signal for selection of current level for an integral path of the charge pump 220;

cpoutip,m denotes positive and negative output signals in the integral path;

sel_digital_filter denotes a control signal for selection of active switched capacitance for the loop filter 230;

dlf_s&h_pwrdb denotes an enabling signal for a sample and hold (SH) component or circuit of the loop filter 230;

sel_dlf_s&h_width denotes a control signal for sample pulse width selection for the sample and hold component of the loop filter 230; and sel_dlf_cmfdbk denotes a control signal for selection of a type of a DLF common mode correction feedback circuitry (a high sel_dlf_cmfdbk may enable an operation amplifier based common mode correction circuitry, and a low sel_dlf_cmfdbk may correct the common mode circuitry using a resistor denoted as Rcmfdbk in FIG. 2).

Figure 3:
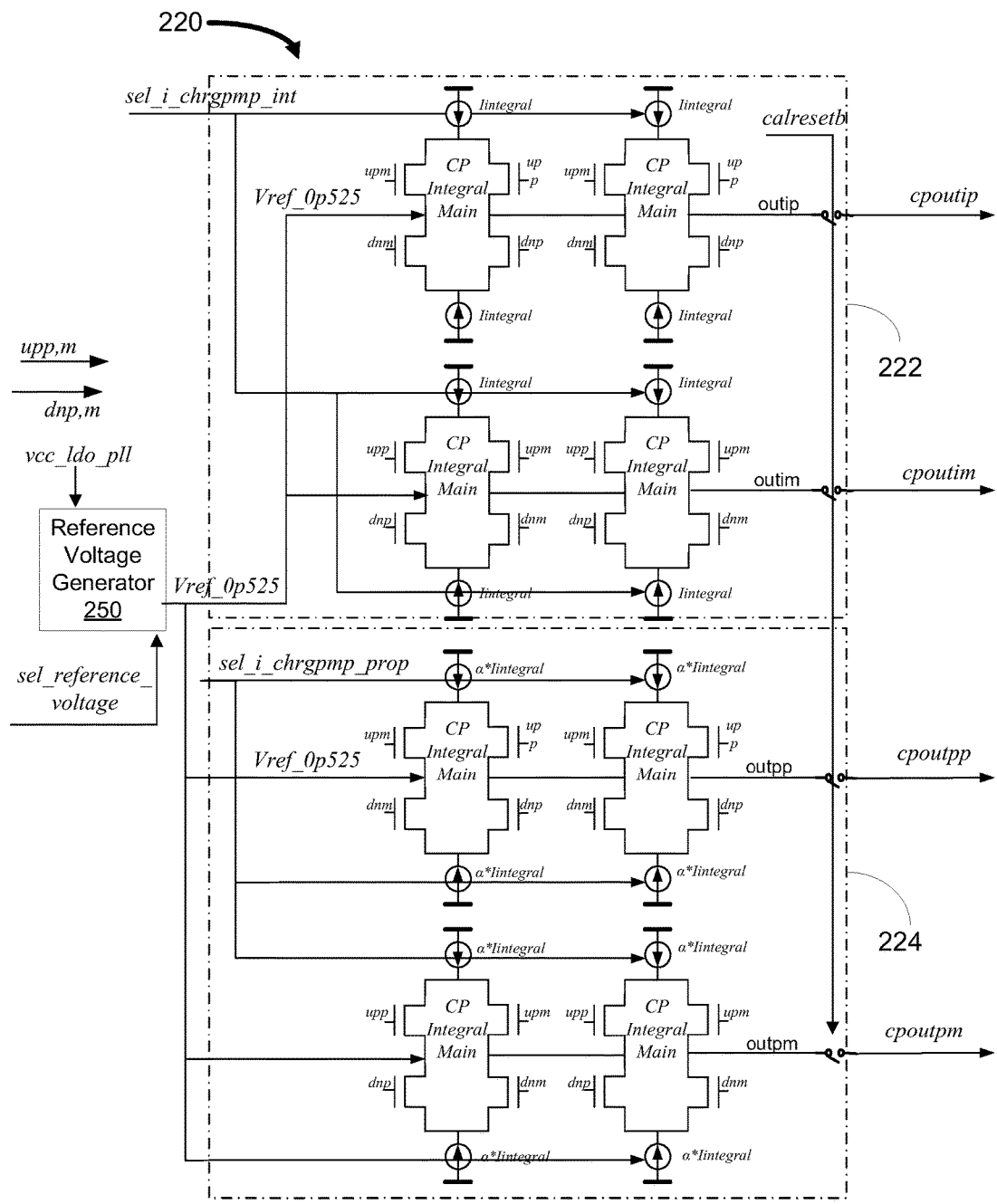
FIG. 3 illustrates an embodiment of a CP with an integral path and a proportional path.
Figure 4:
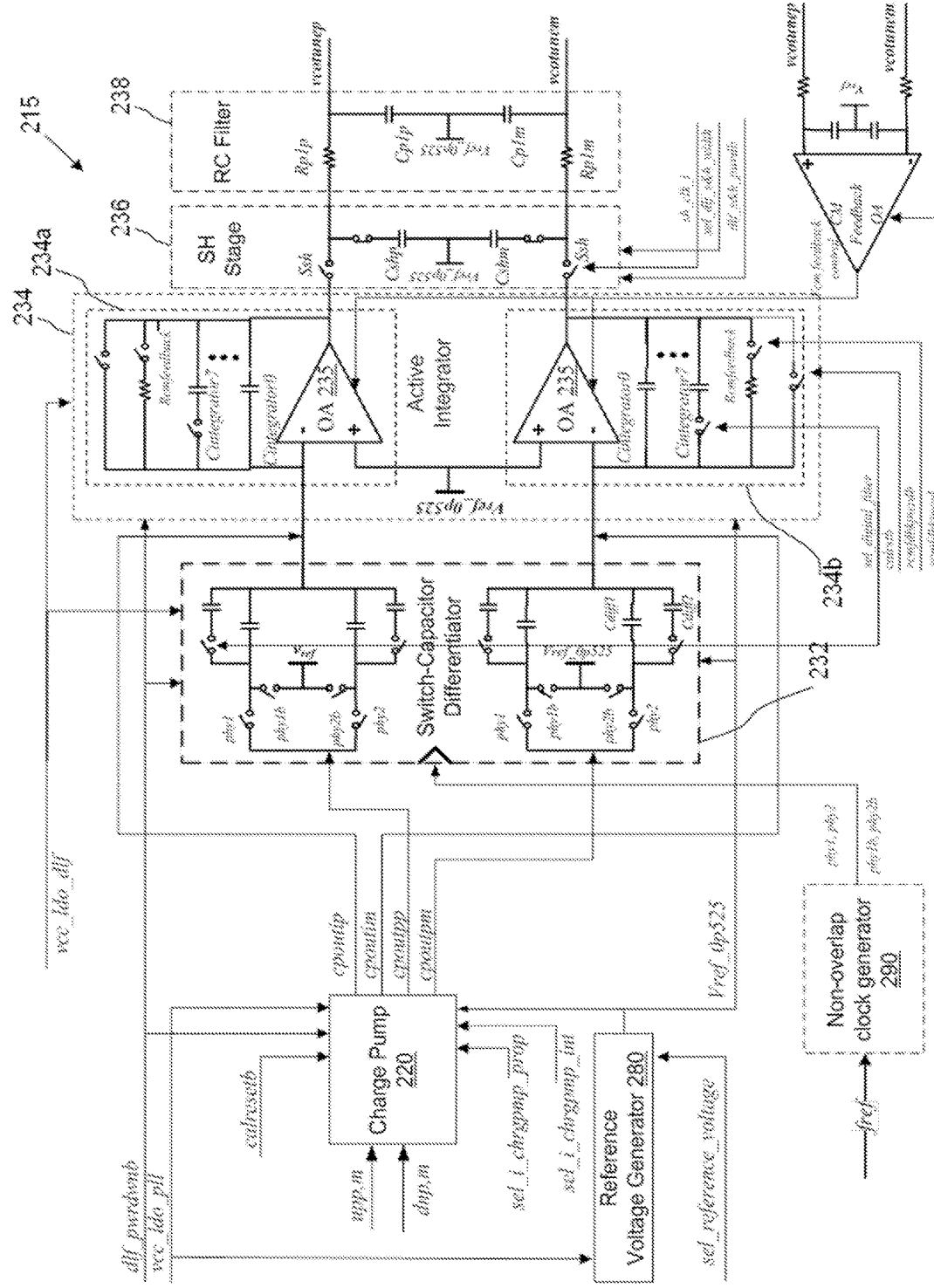
FIG. 4 illustrates an embodiment of a PLL core.

As shown in FIG. 2, the PLL 200 may comprise a PLL core 215 including the CP 220, the loop filter 230, and a reference voltage generator 280. Since FIG. 3 and FIG. 4 illustrate certain details of the PLL core 215, with FIG. 3 mostly illustrating the CP 220 and FIG. 4 illustrating part of the PLL core 215, FIGS. 2-4 are discussed herein in concert.

In the PLL 200, output signals of the PFD 210 (i.e., upp, upm, dnp, and dnm signals) may feed into the CP 220. In an embodiment illustrated in FIG. 3, the CP 220 may comprise two differential portions or paths, which are referred herein as an integral path 222 and a proportional path 224, configured to receive output signals from the PFD 210. Compared with the disclosed CP 220, a conventional CP may include only one of the two paths 222 and 224. Thus, each of the integral path 222 and proportional path 224 may be considered as a separate CP if desired, since each of the paths 222 and 224 may include one or more CPs. In this case, the CP 220 is actually a combination of multiple CPs. Thus, it can be seen that a single CP or CP path in a PLF may be reconfigured to work as one of two CP paths in a DLF disclosed herein.

The two paths 222 and 224 may have the same or similar differential architecture, but may have different current strengths. For example, as shown in FIG. 3, input currents of the CP 220 denoted as sel_i_chrgpmp_int and sel_i_chrgpmp_prop may have different amplitudes. Suppose the integral current sel_i_chrgpmp_int has an amplitude denoted as Iintegral, the corresponding proportional current sel_i_chrgpmp_prop may have an amplitude denoted as α*Iintegral, where α denotes a ratio between the two current amplitudes. The integral path 222 may produce or generate positive and negative output signals denoted as cpoutip and cpoutim respectively, while the proportional path 224 may generate positive and negative output signals denoted as cpoutpp and cpoutpm respectively. In some examples, proportional CP path 224 is N times scaled replica of integral CP path 222, where N is programmable from 10 to 40.

In an embodiment, the CP 220 may be arranged to improve its linearity and thereby decrease differential output phase noise. The PLL noise may be inversely proportional to a pulse width of the CP 220, "up" versus "down" charge mismatch, and "up" to "down" pulse duration ratio. Specifically, the charge mismatch and the pulse duration ratio may worsen with short control pulses, as charge injection effects may become significant in that case. To maintain continuity in the current delivery process and facilitate fast current switching, while minimizing charge injection, replica charge pumps may be incorporated into the integral path 222 and/or proportional path 224. Thus, the integral path 222 and/or the proportional path 224 may include not only a main CP but also a replica CP. The main-replica arrangement may allow current to flow continuously to and from CP current sources. Continuous current flow may eliminate or reduce charge injection from large current source devices, thereby reducing dynamic charge pump "up" and "down" current mismatch. Further, the operational bandwidth of replica CP may be equal to the main CP, which may allow fast current source switching and generation of rectangular current pulses (e.g., duration as short as 50 ps). Moreover, to further reduce CP mismatch, the main and replica CP center taps may be pinned to reference voltage source(s). Pinning voltages may be accomplished by connecting main CP output to an input of the active integrator 234 directly, or through the switch-capacitor differentiator 232. The voltage pinning approach may allow decoupling of the CP center tap voltages from the VCO tuning voltage, which is an output signal of the active integrator 234. Therefore, "up" and "down" CP current mismatch in a disclosed PLL may depend only on PVT.

The PFD 210, the CP 220, and other components such as reference and feedback clock buffers may be powered by a 1.1 V supply (i.e., vcc_ldo_pll), which may be created by a 10 mA regulator. Therefore, a reference clock input and a feedback clock input may be 1.1 V level CMOS signals. The active loop filter 230 including the switch-capacitor differentiator 232, the differential integrator 234, and the non-overlapping clock generator 290, integrator bias and common mode feedback circuitry, reference voltage generator 280, and differential SH circuit 236 may be arranged in a module or cell sometimes referred to as a digital loop filter (DLF). The loop filter 230 may be a low pass filter and may be powered by a separate 5 mA low drop-out voltage regulator. Both regulators and common mode feedback circuitry may be powered directly by a 1.8 V on-board power supply. In an embodiment, control inputs may be 0.9 V CMOS signals.

Now refer to FIG. 4. Note that some of the notations used in FIG. 4 (and other figures) are listed as follows:
vcc_ldo_dlf denotes a regulated DC voltage for the DLF circuitry supplied by an on-die low drop out (LDO) regulator;
VSS denotes a ground or virtual ground;
vref_0p525 denotes an adjustable reference voltage (e.g., a nominal value of 0.525 volts);
calrestb denotes a switch used to set VCO inputs to the reference voltage by shorting integrator capacitor. The calrestb switch may remain closed during VCO calibration, and may remain open during normal operation;
cint_sel denotes a switch coupled to a capacitor in the active integrator 234 and used to increase or decrease integrator capacitance value, thereby adjusting PLL bandwidth and transfer characteristics;
Cintegrator<0:7> denotes values of capacitors in the active integrator 234 (e.g., on pF range which is much smaller than the external capacitor 132 in FIG. 1);
Cintegrator0 to Cintegrator 7 denotes adjustable integrator capacitors connected to cint_sel switches;
rcmfdbkpwrdb denotes a switch coupled to a resistor in the active integrator 234 and used to set the output common mode voltage when operational amplifier (OA) common mode feedback is disabled by "rcmfdbkpwrd" digital control;
Rcmfdbk denotes a resistor in the loop filter integrator that is used to implement common mode feedback when low noise and low accuracy common mode feedback is required;
sh_clk_i denotes a sample and hold input clock. Its frequency may be equal to the reference clock and its width adjusted by sel_dlf_s&h_width digital control;
phy1 denotes a switch coupled to a capacitor and controlled by phy1 clock at half reference rate. That clock may be generated by the non-overlapping clock generator 290;
phy1b denotes a switch coupled to a capacitor and controlled by phy1b clock at half reference rate. That clock may be generated by the non-overlapping clock generator 290 and complimentary but non-overlapping to the phy1;
phy2 denotes a switch controlled by phy2 clock at half reference rate. That clock may be generated by the non-overlapping clock generator 290;
phy2b denotes a switch controlled by phy2b clock at half reference rate. That clock may be generated by the non-overlapping clock generator 290 and complimentary but non-overlapping to the phy2;
Cdiff1 denotes a first differentiator capacitor;
Cdiff2 denotes a second differentiator capacitor;
Sel_reference_voltage denotes a digital control signal for adjusting reference voltage;
Dlf_pwrdnb denotes a signal used to shut down integrators and integral CPs allowing PLL to operate with external capacitor (i.e., in the passive mode);
vtunep is a positive output of the loop filter 230 (i.e., the same with vcotunep in FIG. 1), which is a tuning voltage for the VCO 240; and
vtunem is a negative output of the loop filter 230 (i.e., same with vcotunem in FIG. 1).

As shown in FIG. 4, the loop filter 230 may comprise a differentiator 232 comprising switches and capacitors. Thus, the differentiator 232 may be referred to simply as a switch-capacitor differentiator. In use, the proportional path 224 of the CP 220 may be coupled or connected to the differentiator 232, which may work at half the speed or rate of the reference clock. Clocks for the switch-capacitor differentiator 232 may be generated by a non-overlapping clock generator 290. Signals cpoutip and cpoutim generated by the integral path 222 may directly feed into an active integrator 234 residing in the loop filter 230, while signals cpoutpp and cpoutpm generated by the proportional path 224 may first be differentiated by the differentiator 232.

The differentiator 232 may comprise a plurality of switches (e.g., phy1, phy1b, and phy2) and one or more capacitors (e.g., Cdiff1, Cdiff2). Any of the one or more capacitors may be coupled in series to at least one of the plurality of switches. The differentiator 232 coupled to the active integrator 234 may be configured to receive two input signals (e.g., cpoutpp and cpoutpm) from the proportional path 224 of the CP 220, generate two output signals by differentiating the two input signals, and feed the two output signals to the differential integrator via two nodes connected to the negative inputs of the OAs 235. Each of these two output signals may be added by their respective cpoutip and cpoutim signals at the two nodes.

As shown in FIG. 4, the active integrator 234 may comprise two portions or parts 234a and 234b arranged in a differential configuration. The pair of differential portions 234a and 234b may each comprise an OA and a number of capacitors and resistors arranged in a parallel fashion. In an embodiment, a positive output of the integral path 222 and a positive output of the switch-capacitor differentiator 232 are summed at the input of the positive portion 234a, while a negative output of the integral path 222 and a negative output of the switch-capacitor differentiator 232 are summed at the input of the negative portion 234b. Input-to-output transfer functions of the active integrator 234 may have one or more zeros and poles. In an embodiment, a zero location generated by the proportional path 224 and the switch-capacitor differentiator 232 may create a zero frequency, which may stabilize the PLL 200. In an embodiment, sizes of capacitors (e.g., Cdiff1 and Cdiff2) used in the switch-capacitor differentiator 232 may be set to about ⅓ to ⅙ of a size of an integrator capacitor (e.g., Cintegrator0, . . . , or Cintegrator7) used in the active integrator 234. This capacitance setting may help to achieve shortest lock time. The zero frequency generated by the switch-capacitor differentiator 232 may be proportional either to a reference clock period or to α (i.e., a current ratio between the integral path 222 and the proportional path 224). Further, the zero frequency may be inversely proportional to the value of an integrator capacitor (e.g., Cintegrator0, . . . , or Cintegrator7). In an embodiment, the zero frequency denoted as f, may be expressed as:

$$f_z = \frac{1}{2*\pi} * \frac{I_{cp\_integral}}{I_{cp\_proportional}} * F_{reference} \quad (1)$$

where Icp_proportional equals sel_i_chrgpmp_prop, Icp_integral equals sel_i_chrgpmp_int, and Freference denotes a reference frequency.

Further, a natural frequency (denoted as $f_n$) of the PLL 200 may be directly proportional to a loop gain and inversely proportional to the value of an integrator capacitor (e.g., Cintegrator0). A bandwidth of the PLL 200 may be adjustable. For example, by switching in or out up to 7 active integrator capacitor units (e.g., Cintegrator1 to Cintegrator7), the bandwidth may be adjusted by three bits. In an embodiment, the active integrator 234 may comprise any suitable number of capacitors coupled to the OAs 235, wherein none of the capacitors has a value greater than 1 pF, and wherein the active integrator does not contain any external capacitor. Additional bandwidth adjustment may be made available by changing the loop gain of the PLL 200, e.g., using different sel_i_chrgpmp_int settings. In some embodiments, achievable PLL bandwidth is from 1.0 Megahertz (MHz) to 5 MHz at 156.25 MHz clock rate and an output frequency at clock distribution of 5-6.4 Gigahertz (GHz). For example, an output frequency of the PLL denoted as $f_u$ may be expressed as:

$$F_u = \frac{1}{2*\pi} * \left( K*R_z + \sqrt{(K*R_z)^2 + 4*K/C_{integral}} \right), \quad (2)$$

where the loop gain:

$$K = I_{cp_{integral}} * K_{vco} * \frac{1}{2*\pi*N_{divider}}, \text{ and}$$

$$R_z = \frac{I_{cp\_proportional}}{I_{cp\_integral}} * \frac{1}{C_{intergral}F_{reference}},$$

Kvco denotes a gain of the VCO 240, $N_{divider}$ equals a sum of division ratios of the CML 250 and CMOS dividers 270 (e.g., $N_{divider}=N_{cml}+N_{cmos}$ and may be between 20 and 50), $C_{integral}$ denotes a capacitance of any the capacitors in the active integrator 234.

In some embodiments, a value of Icp_proportional may be programmable from 20 uA-160 mA in 20 uA steps. Further, a value of Icp_integral may be programmable from 320 uA-1600 mA in 80 uA steps. Thus, current adjustment in the CP 220 may allow setting α (i.e., proportional to integral charge pump ratio) between roughly 10 to 40 times, which in turn may allow greater than 45 degrees phase margin through the entire range of PLL bandwidth adjustment.

Based on the input tuning signals, the VCO 240 may generate an oscillating signal with a locked phase and/or frequency, which is a feedback signal (e.g., feedback voltage denoted as Vcm feedback control in FIG. 4). Directly or indirectly based on this feedback signal(s), components in the control path (e.g., PFD 210, CP 220, and phase loop filter 230) may operate to generate locked phases or frequencies. In the feedback path, the feedback signal may feed into the CML divider 250, followed by the CIVIL to CMOS converter 260, and then followed by the CMOS divider 270. A person of ordinary skill in the art will understand that modifications can be made within the scope of this disclosure. For example, certain modules or components (e.g., CIVIL to CMOS converter 260 and the CMOS divider 270) may be arranged differently or skipped.

Compared with one or more passive integrators that may be used in a conventional PLF, the active loop filter 230 with one or more active integrators may offer various advantages. For a first example, a positive node of an OA in the active integrator 234 may be connected to the reference voltage generator 280, which may produce a reference voltage equaling about half of Vcc_Ido_pll. If Vcc_Ido_pll=1.1 volts, the reference voltage may equal 0.525 V (thus 0p525 is used in some figures to denote the reference voltage). Since the center taps of the CP 220 may be connected to the OAs 235 of the active integrator 234, it can be seen that the active integrator 234 may set all center tap voltages of the CP 220 to a known value (e.g., 0.525 V). In an embodiment, all center taps of the CP 220 are coupled to an input of at least one of the OAs 235. The voltage stability may allow reduction of the "up" to "down" current mismatch in a lock condition over temperature. This voltage stability may also lead to partial reduction of the said mismatch over process corners.

For a second example, the use of the active integrator 234 may simplify a differentiator switching network. That is, the active integrator 234 may help eliminate a requirement for dual Gm discharge amplifiers, which may otherwise be required to discharge differentiator capacitors. Such amplifiers would consume more current than the active integrator 234 because of their dual Gm structure. In this disclosure, voltages may be discharged to the reference voltage using relatively simpler amplifiers (e.g., the OAs 235 do not have to be dual Gm amplifiers). For a third example, the common mode voltage of the OAs 235 may be set to a value optimal for the VCO 240 by using an analog common mode feedback circuitry. As shown in FIG. 4, a Vcm feedback control signal generated by the VCO 240 is fed into the two OAs 235. Note that the active integrator 234 may comprise one or more OAs 235, each of which may be configured to receive the feedback signal from the VCO 240. As shown in FIG. 4, the active integrator 234 is a differential integrator comprising a differential pair of OAs 235, wherein the differential pair of OAs 235 are both configured to receive the feedback signal.

For a fourth example, the active integrator 234 may allow for additional zero(s) and pole(s) aside from the main integrator capacitor to reshape its signal and noise transfer functions. In some applications, non-dominant additional zero(s) and pole(s) may be implemented. In an embodiment, up to two additional poles may be realized using two RC filters, such as the RC filter 238 shown in FIG. 4. The RC filter 238 may comprise at least one pair of a resistor (Rp1p or Rp1m) and capacitor (Cp1p or Cp1m). Further, the RC filter 238 may be coupled to the active integrator directly or via a sample and hold circuit 236. The RC filter 238 may be configured to filter the one or more tuning signals generated by the active integrator 234 or the SH circuit 236. Filtering may generate one or more filtered tuning signals, which are then fed to the VCO 240. The RC filter may lower clock feed through and residual thermal noise from the VCO 240, the CIVIL divider 250, the CMOS divider 270, and the CP 220.

As shown in FIG. 4, the differentiator 232 may have two differentiator capacitors denoted as Cdiff1 and Cdiff2. The Cdiff2 capacitor may be controlled by the external control signal "sel_digital_filter". Specifically, the differentiator 232 may comprise one more capacitor branches, which can be switched in or out by static or dynamic control signal(s). The static signal "sel_digital_filter" may switch in (or add) various amounts of "Cdiff2" (capacitance) to Cdiff1" versus a value of an integration capacitor denoted as "Cintegrator". The amount of "Cdiff2" added to "Cdiff1" changes a locking profile of the PLL 200 and may control the amount of the tuning voltage overshoot for different Cintegral values. In addition, "Cdiff2" capacitor may be switched in (added to "Cdiff1") by a control signal synchronized with reference clock divided by an integer ratio N.

The sample and hold circuit 236 may be incorporated into the loop filter 230 to achieve further PLL jitter reduction. Specifically, outputs of the active integrator 234 may feed into the sample and hold circuit 236, which may also have a differential configuration. The sample and hold circuit 236 may contain switches and adjustable capacitors connected in series to a differential virtual ground. As shown in FIG. 4, the sample and hold circuit 236 comprises capacitors (Cshp and Cshm), which may charge (by closing switches Ssh and other switches) for roughly 20% of the reference clock period. Charging may generate a tuning signal (e.g., control voltage) based on which the VCO 240 operates. After charging, the capacitors may hold (by opening switches Ssh and other switches) the control voltage for the rest of the clock period. Note that during the hold period, the PLL 200 may be unlocked, thus neither CP noise nor deterministic or random noise from the active integrator 234 may propagate to the control pins of the VCO 240. In use, voltage charging and holding by the sample and hold circuit 236 may be executed every reference clock period. Further, the duration of charging and/or holding stages may be adjustable. Clocks for the differential sample and hold circuit 236 may be generated by the non-overlapping clock generator 290.

The sample and hold circuit 236 coupled to the active integrator 234 may be configured to receive a reference clock signal (e.g., sh_clk_i) with a period comprising a first duration or section (e.g., about 20% of the period) and a second duration (e.g., about 80% of the period). The first duration is a sampling duration, thus the sample and hold circuit 236 may close at least one switch (e.g., Ssh) of the SH circuit 236 at the beginning of the first duration, and sample the tuning signal from the active integrator during the first section. Sampling may be done by charging at least one capacitor (e.g., Cshp and/or Cshm) of the SH circuit 236. The second duration is a holding duration, thus the sample and hold circuit 236 may open the at least one switch (e.g., Ssh) at the beginning of the second duration, and hold the charge on the at least one capacitor during the second duration. A ratio of the sample duration to the hold duration may be configurable by the "sel_dlf_s&h_width" control signal. This ratio may have any suitable value (e.g., from ⅕ to ¹⁄₂₀).

Figure 5:
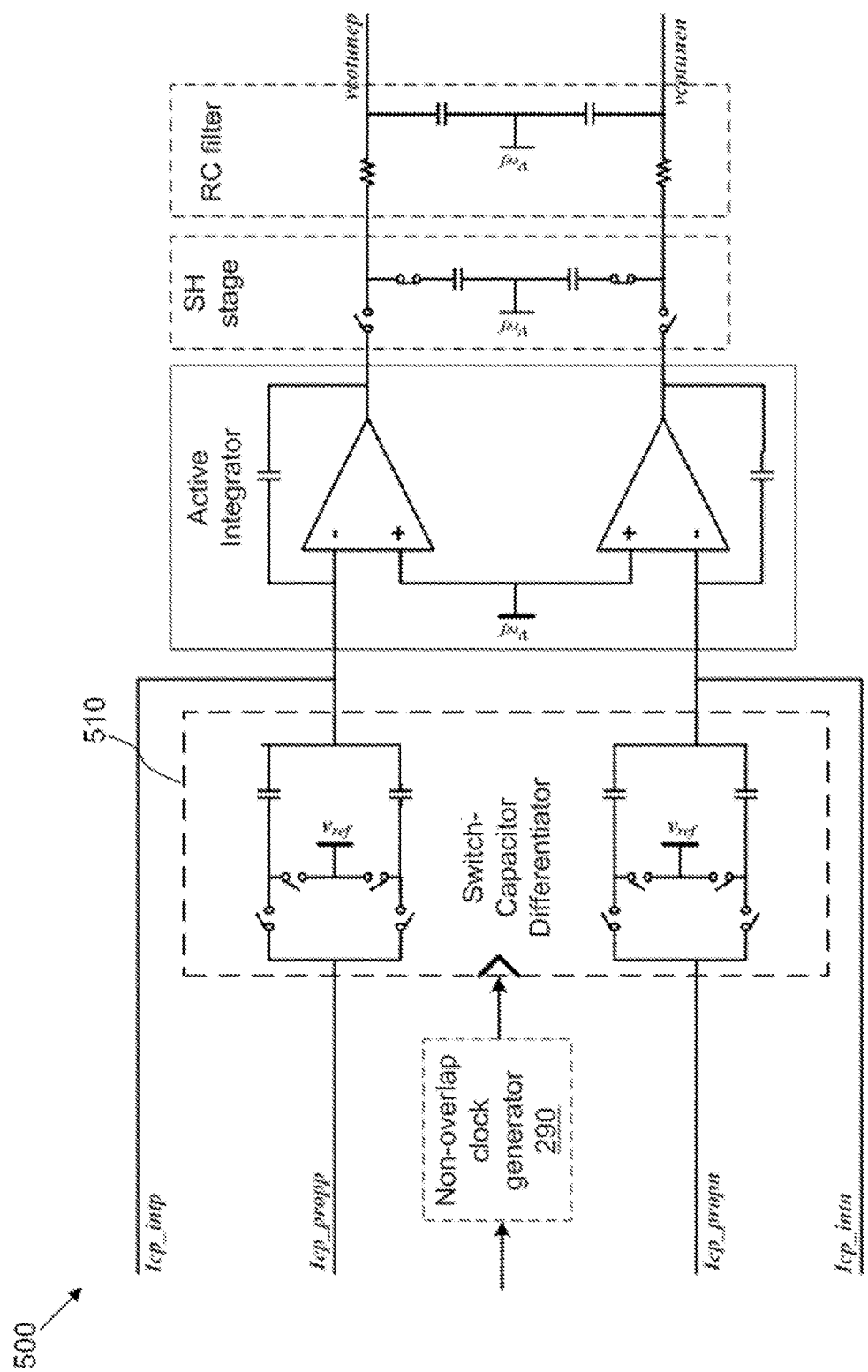
FIG. 5 illustrates part of the components in an embodiment of an active loop filter.

FIG. 5 illustrates part of the components in an embodiment of an active loop filter 500, which may be largely similar to the loop filter 230 except that the structure of its differentiator 510 may be different from the differentiator 232. As shown in FIG. 5, the differentiator 510 has two asymmetric portions arranged in a differential configuration that is different from the differentiator 232. In an embodiment, the differentiator capacitor in the differentiator 510 may not be adjustable. It should be understood that a differentiator or any other component disclosed herein may be flexibly designed to have various structures, as long as principles of the present disclosure are kept.

Conventionally, a VCO tank (e.g., the VCO 140) may comprise an inductor and at least one capacitor forming an inductor-capacitor (LC) circuit for tuning in different frequency bands. For example, the following formula shows a conventional way of adjusting VCO tank capacitance (denoted as $C_{tank}(n)$ over frequency bands.

$$C_{tank}(n) = C_{const} + n * C_{linear_{unit}} * + C_{nonlinear_{unit}} * \text{constant}, \quad (3)$$

where n denotes a VCO band number, Cconst denotes a constant portion of $C_{tank}(n)$ that does not vary with frequency, $C_{linear_{unit}}$ and $C_{nonlinear_{unit}}$ denotes linear and nonlinear portions of $C_{tank}(n)$, the term "constant" denotes a constant number dependent on the capacitance of a varactor and other VCO parameters.

In a conventional VCO tank, due to the inherent nonlinearity of a LC circuit, the spacing between frequency-tuning voltage curves may be nonlinear, e.g., resembling a parabolic curve. Sometimes, the VCO tuning gain across LC VCO bands may vary as much as several hundred percent. The following formula shows a tuning gain of a conventional VCO, where $F_{vco}$ denotes free-running VCO frequency, and $V_{tune}$ denotes differential tuning voltage for the VCO.

$$VCO_{tuning\_gain}(n) = \frac{dF_{vco}}{V_{tune}} \approx \frac{\partial C_{tank}(n)}{\partial V_{tune}}, \quad (4)$$

Figure 6:
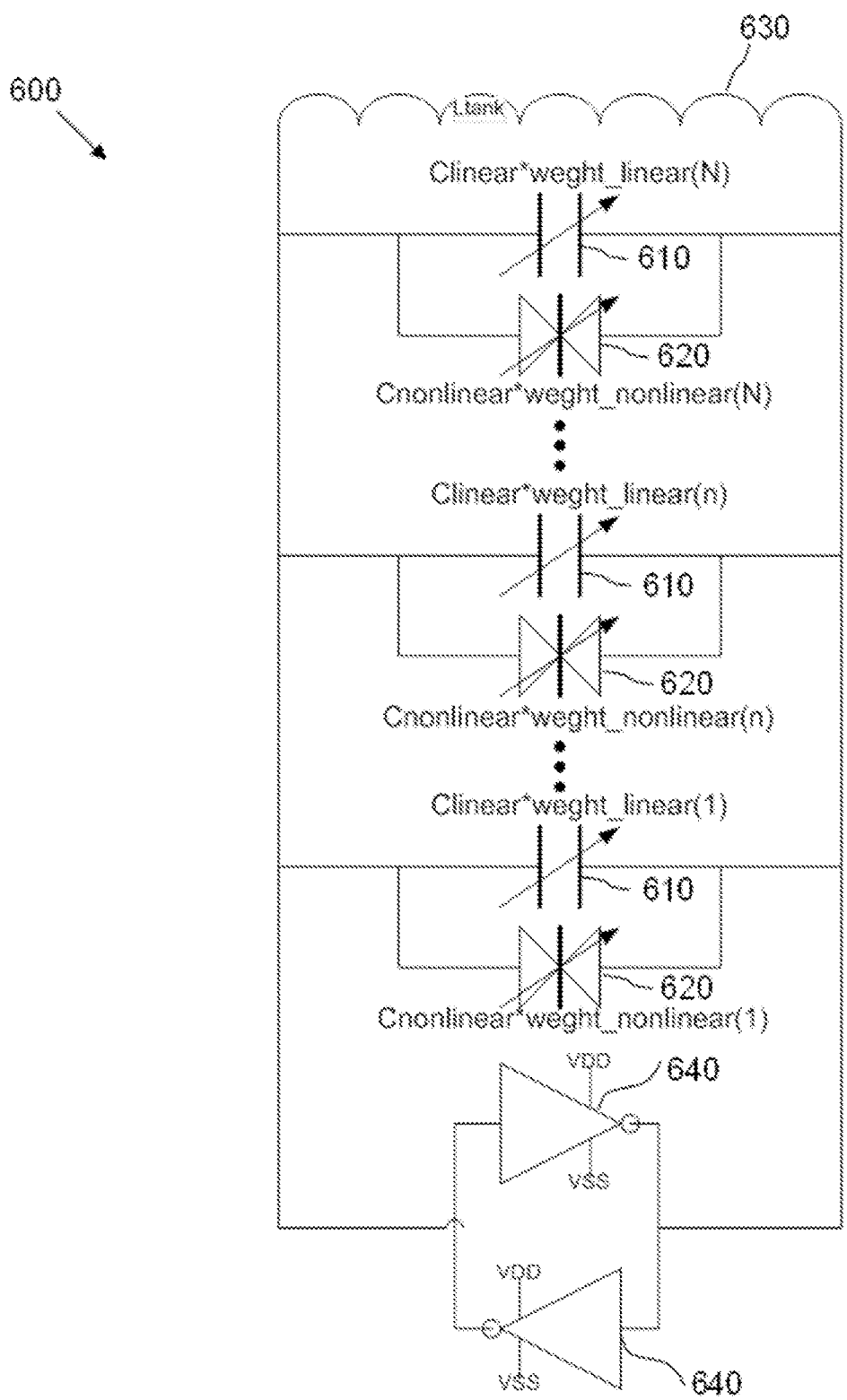
FIG. 6 illustrates part of components used in an embodiment of a VCO.

In this disclosure, the tuning range of a PLL may be extended by using a weighed combination of linear and nonlinear tuning elements in an inductor-capacitor (LC)-based VCO tank. FIG. 6 illustrates part of components used in an embodiment of a VCO 600, which may be the same or similar to the VCO 240. The VCO 600 may be used to extend PLL lock range over PVT and reduce VCO tuning gain variation across VCO bands. VCO tuning characteristics (e.g., frequency versus voltage) may be linearized by utilizing a weighted combination of linear and nonlinear frequency tuning elements in a single differential LC-based VCO tank.

As shown in FIG. 6, linear tuning elements in a disclosed VCO tank may include N capacitors 610 and non-linear elements may include N varactors 620, where N is a positive integer. The capacitors 610 may be made of metallic material(s), and the varactors 620 may be tunable metal-oxide-semiconductor (MOS) varactors. The VCO tank 600 may further comprise an inductor 630 and OAs 640, which are coupled to source voltages and ground denoted as VDD and VSS respectively. In a weighted combination, the capacitance of a varactor 620 number n, denoted as Cnonlinear, may be multiplied by a weighted coefficient denoted as weight_nonlinear(n), where n is an integer between 1 and N. Similarly, the capacitance of a capacitor 610 number n, denoted as Clinear, may be multiplied by another weighted coefficient denoted as weight_linear(n). Since the two capacitors are in parallel, their total capacitance value (denoted as Ctotal(n)) may be a weighted sum of the two capacitance values, that is, $$Ctotal(n) = Clinear * weight\_linear(n) + Cnonlinear * weight\_nonlinear(n), \quad (5)$$

In implementation, when the VCO band of operation changes, the weighted combination scheme may keep the ratio of variable-to-constant capacitance constant. Accordingly, the weighted combination may equalize band spacing and reduce VCO gain variation across different frequency bands. The weighted coefficient of each element may depend on factors such as VCO band number, MOS varactor capacitance polynomial coefficients, total number of VCO bands, VCO frequency, and so forth. For example, one method of adjustment for the VCO tuning capacitance may be illustrated by the following formulas:

$$C_{tank}(n) = C_{const} + C_{linear_{unit}} * \text{Weight}_{linear} + C_{nonlinear_{unit}} * \text{Weight}_{nonlinear} \quad (6)$$

$$\text{Weight}_{linear} = n; \text{Weight}_{nonlinear} = \text{constant} + n \quad (7)$$

In this case, linear capacitance may change in the same way as in a conventional VCO, but a number of varactors may follow a band number n of the VCO, which is different from the conventional VCO (number of varactors may be constant as in conventional VCO). In implementation, the weights for linear and/or nonlinear capacitors may be adjusted based on the band number. As an example, script or pseudo code shown in Table 1 below may be used to achieve an optimal VCO gain and band spacing variation for specific VCO design. A person with ordinary skill in the art will understand the script.

TABLE 1 an examplary script for linearizing a VCO

```
% VCO tune
close all
clear all
N=32;             % number of VCO bands
n=[1:N];          % band number
Lmax=100;         % number of tuning voltage points
Ltank=400e-12;                % tank inductor value
Cconst = 350e-15;             % constant tank cap including parasitic capacitance
Clin_unit=20e-15;             % unit tank tuning cap [fF]
Cvar0 = 4e-15;    % varactor capacitance zero order tuning coefficient
alpha = -1;       % varactor capacitance first order tuning coefficient
betha=-0.3*alpha;             % varactor capacitance second order tuning coefficient
gamma=1;          % nonlinear capacitance tuning coefficient
delta=0.5;        % constant capacitance tuning coefficient
Wlinear = n- n.^delta; % band dependent variable capacitance weight
Wnonlinear =10+ n.^gamma; % band dependent constant capacitance weight
for l=1:Lmax
    Vtune(l)=0.5 *(l-1)/Lmax;
    Cnonlinear_unit(l)=Cvar0*(1+alpha*Vtune(l)+ betha*Vtune(l)^2);
    Ctank(l,:) =Cconst + Clin_unit*Wlinear + Cnonlinear_unit(l)*Wnonlinear;
    Fvco(l,:)=1/2/pi./sqrt(Ltank*Ctank(l,:));
end
figure(1), plot(Vtune, Fvco/1e9, 'LineWidth',2), grid on; %
xlabel('VCO tuning voltage [V]')
ylabel('VCO frequency [GHz]')
```

In an embodiment, some or all frequency-voltage curves may be linearized with a maximal spacing between each curve. As a result, a maximal frequency coverage of 45-50% may be achieved by one VCO, and the VCO tuning gain variation may be reduced to 75%.

Figure 7:
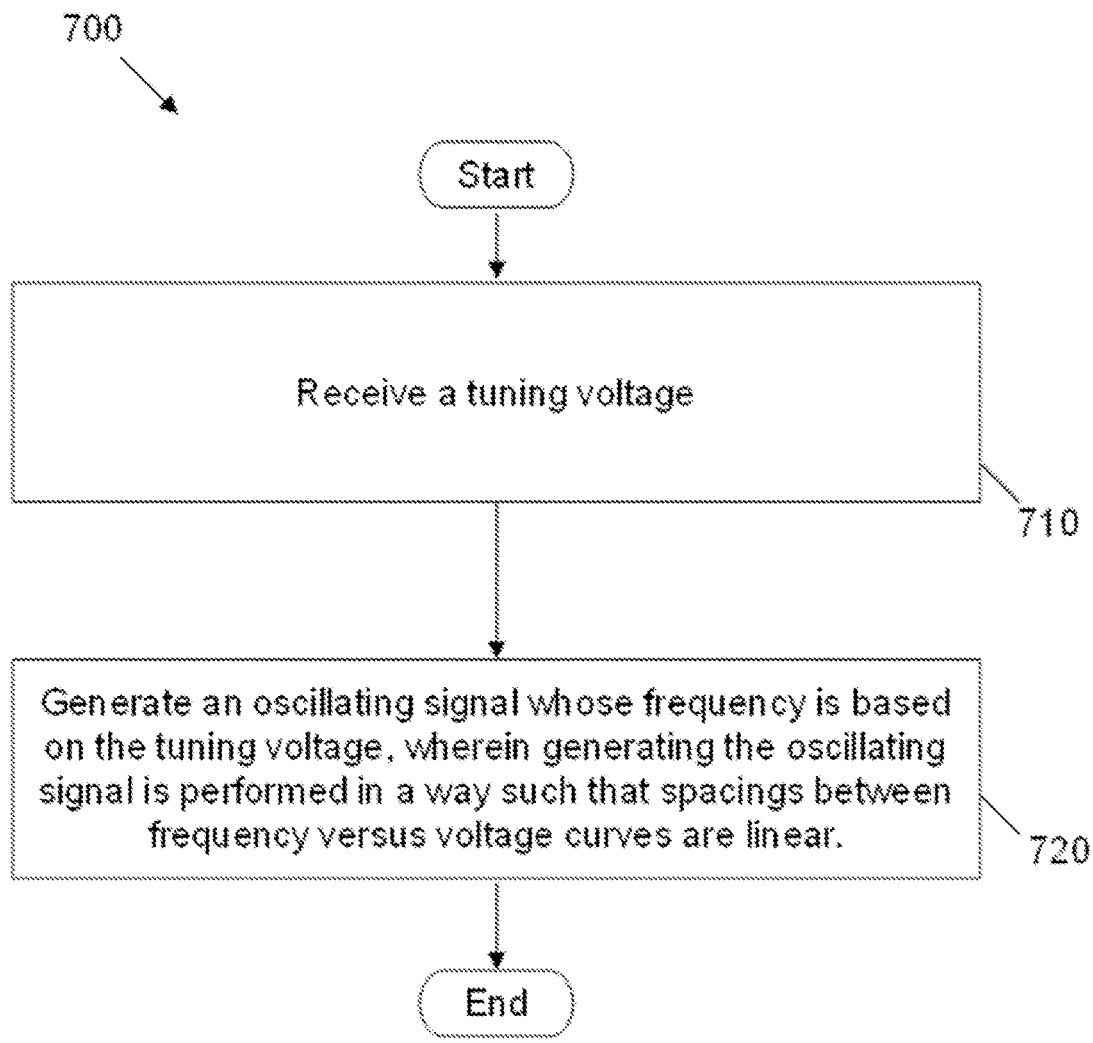
FIG. 7 illustrates an embodiment of a VCO linearization method.

FIG. 7 illustrates an embodiment of a VCO linearization method 700, which may be implemented by a VCO in a PLL. The method 700 may start in step 710, where the method 700 may receive a tuning voltage. Note that the tuning voltage may be a single signal or a combination of multiple tuning signals (e.g., vcotunep and vcotunem signals in FIG. 4). In step 720, the method 700 may generate an oscillating signal whose frequency is based on the tuning voltage. The oscillating signal is a feedback signal, which can be used in the feedback path of the PLL. Recall that a relationship between the tuning voltage and the frequency of the oscillating signal is characterizable via frequency versus voltage curves.

Generating the oscillating signal in step 720 may be performed in a way such that spacings between frequency versus voltage curves are linear, and a slope of the curves is substantially constant (note that variations within a certain limit are possible). In an embodiment, to enable linear tuning characteristics, the VCO comprises a number of linear elements and a number of nonlinear elements, wherein a total capacitance of the VCO is a weighted combination of capacitances of the linear elements and capacitances of the nonlinear elements. Further, each of the linear and nonlinear elements corresponds to a weight in the weighted combination, and the weight of each element is determined based on a VCO band number.

It should be understood that a PLL disclosed herein may be used for any application. For example, the PLL may be included into a 10 to 64 Gigabits per second (Gb/s) Backplane Input/Output (I/O) transciever.

Figure 8A:
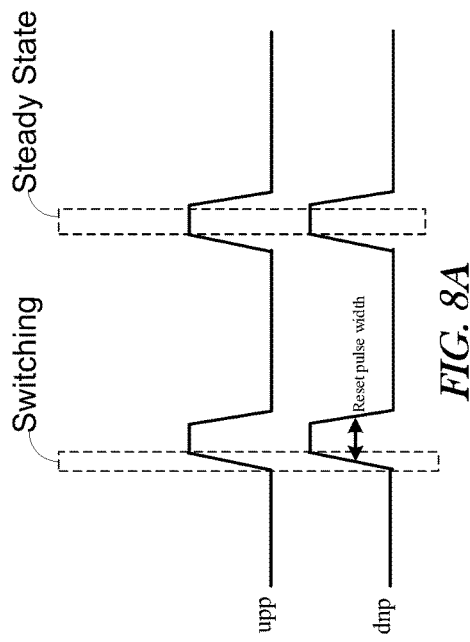
FIG. 8A shows switching and steady states for upp and dnp signals output by a phase frequency detector of the PLL.

As noted above, charge pump jitter can be an acute contributor to clocking jitter and therefore the reduction of charge pump noise may in some applications substantially reduce PLL noise. Accordingly, in a further example embodiment the configuration of the charge pump 220 as disclosed above is modified to mitigate against possible noise introduced by integral CP path 222 and proportional CP path 224. In this regard, the equation (8) below represents flicker noise that can be contributed in either of the integral CP path 222 or the proportional CP path 224. The flicker noise equation (8) represents current source noise in steady state (see FIG. 8A), excluding switching noise and thermal noise.

Flicker Noise:

$$\overline{I_n^2}(\text{flick}) = G_m^2 * \overline{V_n^2} = \left(2*\mu C_{ox}\frac{W}{L}I\right)*\frac{K}{C_{ox}WLf} = \frac{2K\mu I}{L^2} * \frac{1}{f} \quad (8)$$

Where: $G_m^2$ is the charge pump trans-conductance squared and $V_n^2$ is the charge pump voltage noise (which is calculated based on transistor parameters such us mobility μ, channel width—W, and length—L, gate oxide capacitance $C_{ox}$, as well as transistor bias current I and frequency f).

As will be appreciated from equation (8), flicker noise is inversely proportional to the frequency f.

Thermal noise is represented as:

$$\overline{I_n^2}(\text{thermal}) = 4kTrG_m \quad (9)$$

The PLL 200 acts as a low pass filter for output current noise in the integral CP path 222 and as band-pass filter for output current noise in the proportional CP path 224 such that thermal noise, because of its low magnitude and absence of 1/f frequency dependency, has much less of an impact than flicker noise. One possible solution to address the flicker current noise introduced by a charge pump is to use a long tail current transistor, however such a solution requires a larger silicon die area and therefore increased component costs. Another solution is to use a large charge pump current to increase the output current to noise current ratio. However, as can be seen from equation (2) above, increasing charge pump current while maintaining the same PLL bandwidth requires a linear increase in PLL capacitor size, which in turn also requires a larger surface area, increased component costs, and increased component current consumption, which makes such a solution uncompetitive.

Accordingly, in example embodiments chopping circuitry is added to the charge pump 220 to reduce output current noise in a space and cost efficient manner. In particular, as will be described in greater detail below with reference to FIG. 9, the charge pump circuit 220 is modified such that the upp,m and dnp,m signals output from PFD 110 are up-converted before being applied to the integral CP path 222 and proportional CP path 224, and the resulting integral and proportional charge pump outputs are then down-converted to provide cpoutip, ptoutim, cpoutpp and cpoutpm signals for the loop filter 230.

Figure 8B:
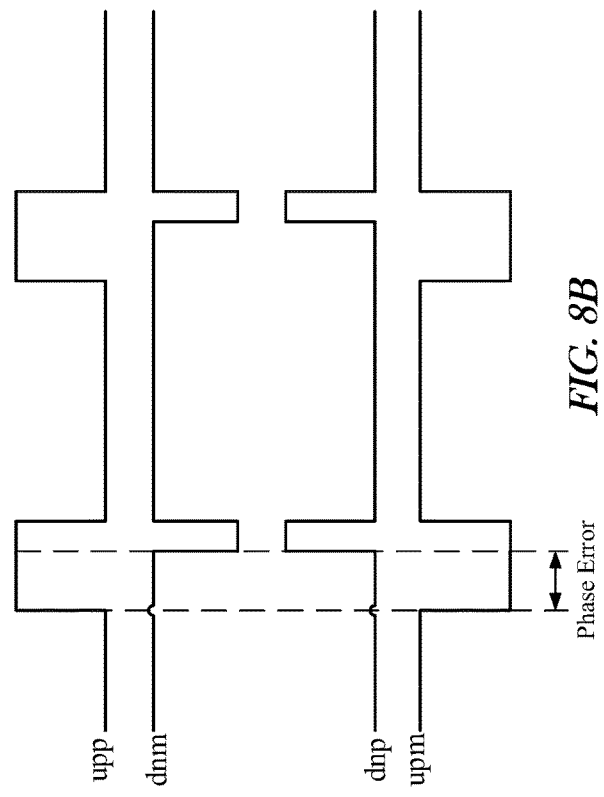
FIG. 8B illustrates phase error represented by upp,m and dnp,m signals output by a phase frequency detector of the PLL.

As illustrated in FIG. 8B, phase error detected by the PFD 110 is represented as timing offset (phase error time) between the upp,m and dnp,m signals. Referring to FIG. 3, the integral CP path 222 charges a capacitance at output outip and discharges a capacitance at output outim for the duration of the phase error time to generate the signals cpoutip and cpoutim. The differential portions of the charge pump generate a current loop for the phase error time. In example embodiments the integral CP path current can change from approximately 10 uA to 160 uA with approximately 10 uA steps. Similarly, the proportional CP path 224 charges a capacitance at output outpp and discharges a capacitance at output outpm for the duration of the phase error time to generate the signals cpoutpp and cpoutpm. In example embodiments the proportional CP path current can change from approximately 1 mA to 2.4 mA with approximately 160 uA steps. In example embodiments, chopper circuits are added to the charge pump 220 to take advantage of the differential architecture of the charge pump 220.

Figure 9:
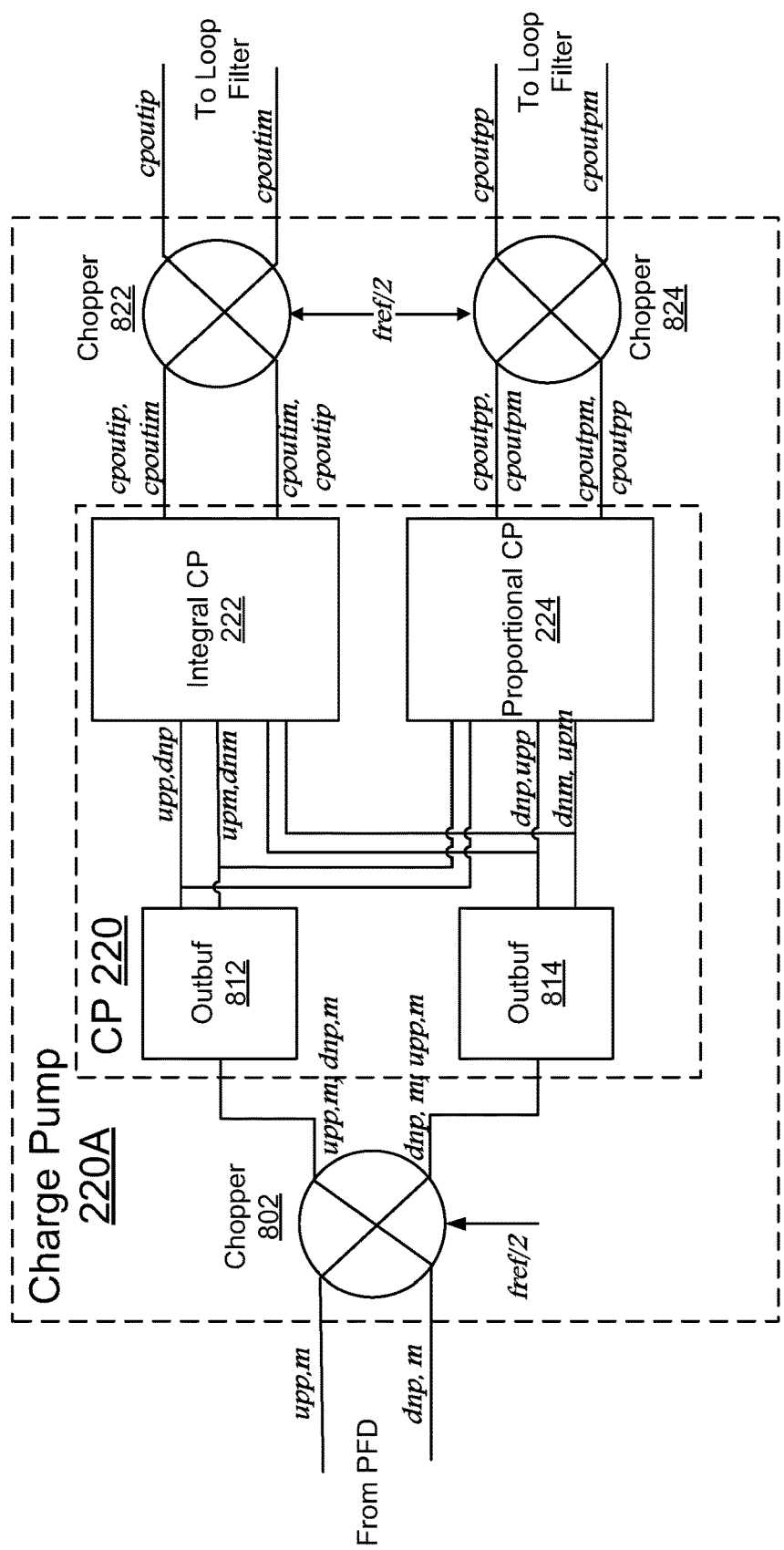
FIG. 9 illustrates an alternative embodiment of a charge pump for use in the PLL of FIG. 3.

In this regard, FIG. 9 shows a modified charge pump circuit 220A according to a further example embodiment. The modified charge pump circuit 220A replaces charge pump 220 in the PLL core 215 shown in FIG. 2. In particular, the modified charge pump circuit 220A incorporates charge pump 220 and also includes an initial intake chopper circuit 802 added at the front end of the charge pump 220 before the integral and proportion charge paths 222, 224, and trailing integral and proportional path output chopper circuits 822 and 824 after integral and proportion charge paths 222 and 224, respectively.

In example embodiments, the chopper circuits 802, 822 and 824 are each implemented using switching circuits that switch two outputs between two inputs based on an input clock rate (the chopping rate). The switching circuit employed by chopper circuits 802, 822 and 824 can be a butterfly switch circuit for example, however other switch implementations, such as multiplexers within phase detectors, can be used in other embodiments so long as the basic functionality of alternating between the switch inputs and the switch outputs in successive clock cycles is maintained.

In example embodiments the chopping rate is selected to be several times higher than the anticipated 3 db corner frequency of current noise. For modern CMOS processes the 3 db corner frequency of current flicker noise is around or greater than 5-10 MHz, and is substantially flicker noise contributed by the charge pumps paths 222, 224. In one example, the chopping rate is half the PLL reference clock rate ($f_{ref}/2$), which may for example be derived from the PLL clock generator 290 (see FIG. 4). Other chopping rate frequencies or sources could be used in alternative embodiments, however the PLL reference clock provides a convenient on-chip source and $f_{ref}/2$ will typically be higher than the corner frequency of any charge pump noise.

Figure 10:
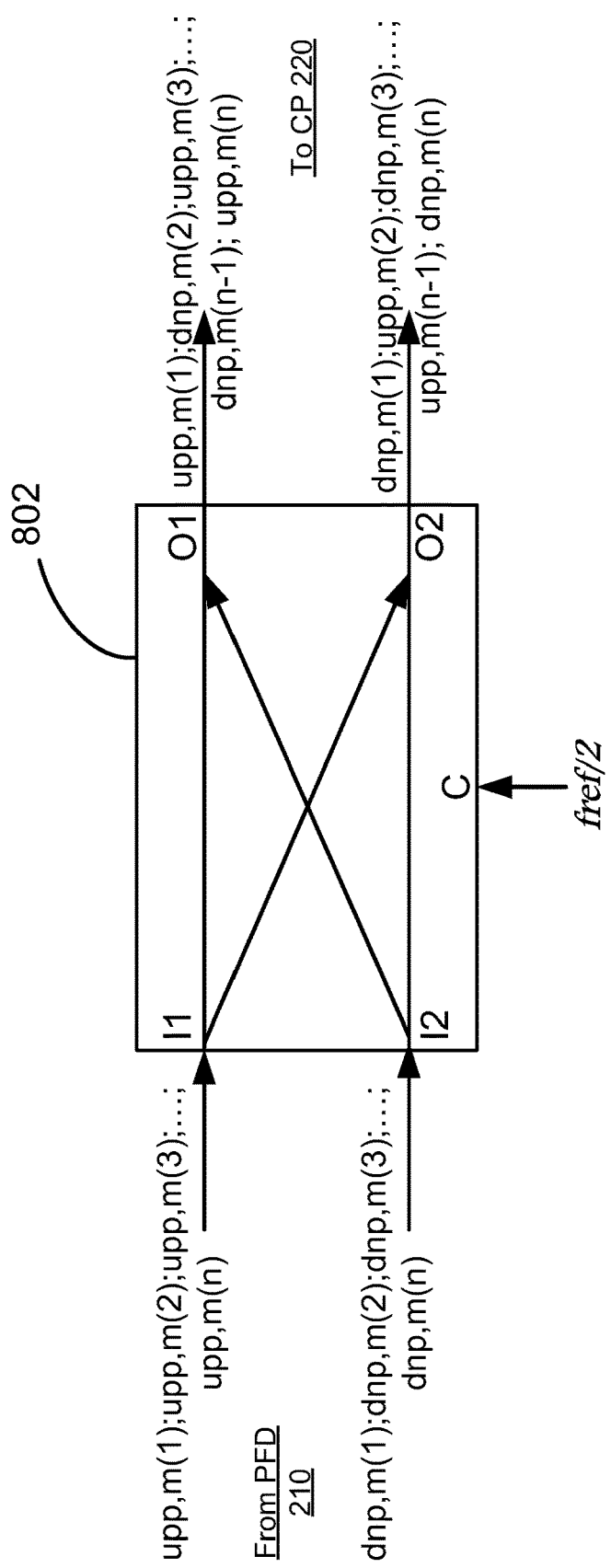
FIG. 10 illustrates a schematic of a front end chopping circuit of the charge pump of FIG. 9 according to an example embodiment.

Referring to FIG. 9, the charge pump 220A receives up signals (positive and negative pull-up signals (upp, m)) and down signals (positive and negative pull-down signals (dnp, m)) as inputs from the phase-frequency detector PFD 210. Prior to providing the up signals upp,m and down signals dnp,m to the integral and proportional CP paths 222, 224 of charge pump 220, the signals upp, m and dnp,m are applied to the initial chopper circuit 802 which modulates the signals upp, m and dnp,m up to the chopper frequency, which is $f_{ref}/2$ in the illustrated embodiment, producing up-converted signals at both chopper circuit outputs that each include alternating upp,m and dnp,m signals. By way of further explanation, FIG. 10 shows a schematic representation of chopper circuit 802. The chopper circuit 802 includes two data inputs I1, I2, a control input C, and two data outputs O1 and O2. One data input I1 is connected to receive up signals upp,m from the PFD 210, and the other data input I2 is connected to receive down signals dnp,m from the PFD 210. The inputs I1 and I2 are alternatively switched between outputs O1 and O2 in response to a control signal received at the control input C. Accordingly, in the example where the control signal applied at control input C1 is a clock signal fref/2, the up signals applied at input I1 will be alternatively sent to outputs O1 and O2 in successive clock cycles, and the down signals applied at input I2 will be output alternatively at outputs O1 and O2. In this regard, FIG. 10 shows up signals upp,m(1); upp,m(2); ... upp,m(3) fed to input I1 and down signals dnp.m(1); dnp,m(2); ... dnp,m(n) fed to input I2, with the annotation numbers in parenthesis representing successive samples that correspond to clock cycles applied at the control input C. As seen in FIG. 10, the chopper output O1 generates an output signal upp,m(1); dnp,m(2); upp,m (3); ... ; dnp,m(n−1); upp,m(n) that includes alternating up and down signals fed from the PFD 210, and chopper output O2 generates an output signal dnp,m(1); upp,m(2); dnp,m (3); ... ; upp,m(n−1); dnp,m(n) that includes alternating down and up signals fed from the PFD 210.

Referring again to FIG. 9, the up-converted alternating up and down signals from each of the chopper outputs O1, O2 are applied as inputs to the charge pump 220. The signals upp,m, dnp,m from output O1 are separated at buffer Outbuf 812 to extract the positive (p) and negative (m) components of each signal to produce alternating positive pull-up signals upp and positive pull-down signalsdnp at one output of Outbuf 812, and alternating negative pull-up signals upm and negative pull down signals dnm at the other output of Outbuf 812. Similarly, up-converted alternating down and up signals dnp,m, upp,m, from chopper output O2 are separated at buffer Outbuf 814 to extract the positive (p) and negative (m) components of each signal to produce alternating positive positive pull-down signals dnp and pull-up signals upp at one output of Outbuf 814, and alternating negative negative pull down signals dnm and pull-up signals upm at the other output of Outbuf 812.

The integral CP path 222 and the proportional CP path 224 of charge pump circuit 220A have the same configuration as shown in FIG. 3. However, as a result of the signal switching done at chopper circuit 802, each of the "up" inputs in the integral and proportional CP paths 222, 224 receive alternating "up" and "down" signals fed from the PFD 210, and each of the "down" inputs in the integral and proportional CP paths 222, 224 receive alternating "down" and "up" signals fed from the PFD 210. For example, referring to FIG. 3: (i) each of the CP inputs labeled "upp" in each of the integral CP path 222 and proportional CP path 224 receive alternating upp and dnp signals; (ii) each of the CP inputs labeled "dnp" in each of the integral CP path 222 and proportional CP path 224 receive alternating dnp and upp signals; (iii) each of the CP inputs labeled "upm" in each of the integral CP path 222 and proportional CP path 224 receive alternating upm and dnm signals; and (iv) each of the CP inputs labeled "dnm" in each of the integral CP path 222 and proportional CP path 224 receive alternating dnm and upm signals.

Accordingly, it will be appreciated that a difference made by adding the front end chopper circuit 802 to the charge pump 220 is that each of the charge pump inputs are fed both up and down signals from the PFD, rather than exclusively up or exclusively down signals.

Figure 11:
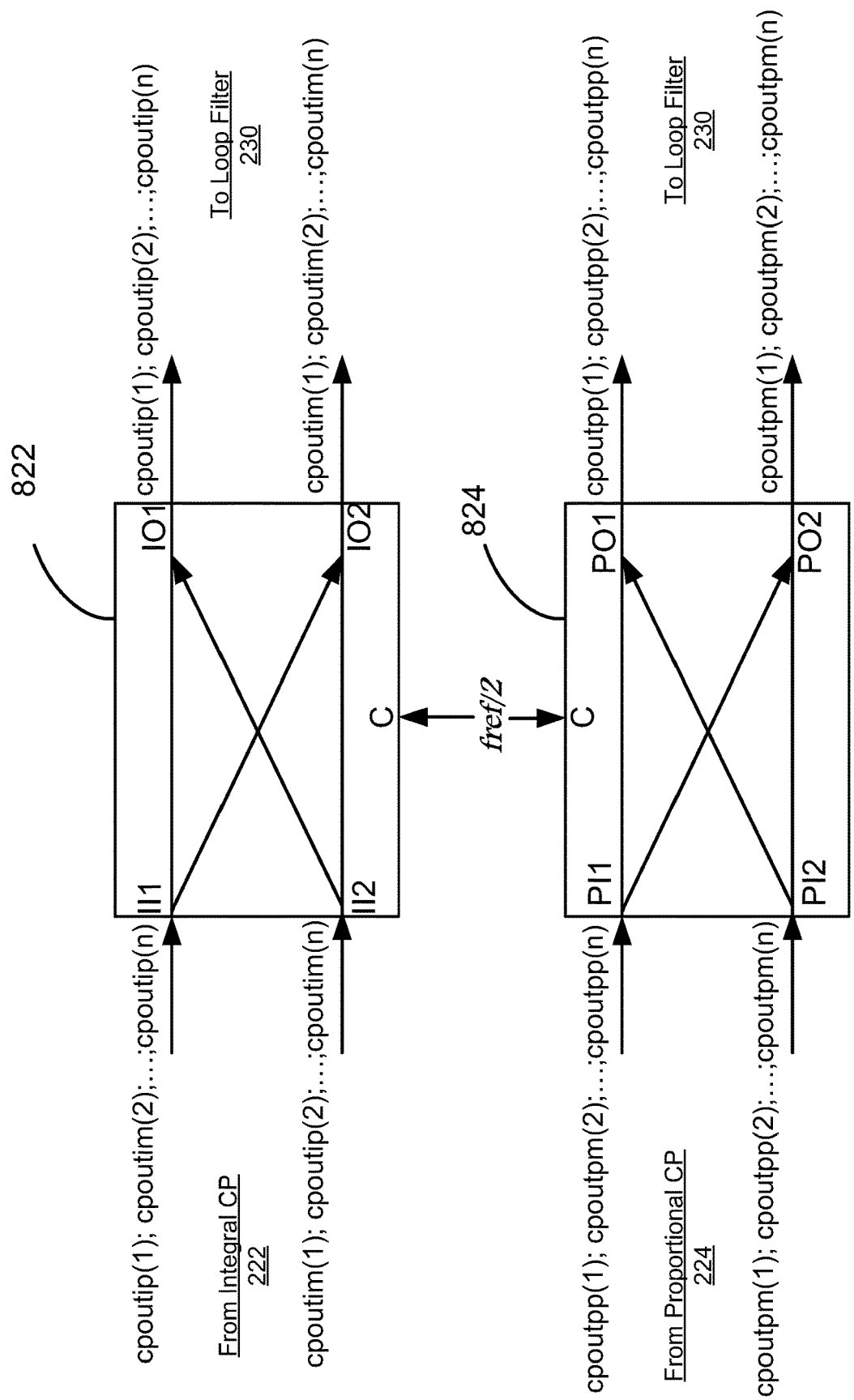
FIG. 11 illustrates a schematic of trailing chopping circuits of the charge pump of FIG. 9 according to an example embodiment.

The integral CP path 222 and the proportional CP path 224 process upp, upm, dnp, dnm signals that have been modulated to a chopping rate that is half the PLL reference frequency ($f_{ref}/2$), and output corresponding up-converted charge pumped signals cpoutip and cpoutim (from integral CP path 222) and cpoutpp and cpoutpm (from proportional CP path 224). In particular, one output of integral CP path 222 (labeled outip in FIG. 3) produces the alternating signal cpoutip, cpoutim, and the other output of integral CP path 222 (labeled outim in FIG. 3) produces the alternating signal cpoutim, cpoutip; one output of proportional CP path 224 (labeled outpp in FIG. 3) produces the alternating signal cpoutpp, cpoutpm, and the other output of integral CP path 224 (labeled outpm in FIG. 3) produces the alternating signal cpoutpm, cpoutpp. The signals output from integral CP path 222 are then applied to integral path chopper circuit 822 where they are down converted and the resulting charge-pumped baseband signals cpoutip and cpoutim are fed as inputs to active loop filter 230. By way of example, FIG. 11 shows a schematic representation of chopper circuits 822 and 824. The integral path chopper circuit 822 includes two data inputs II1, II2, a control input C, and two data outputs IO1 and IO2. One data input II1 is connected to receive alternating positive and negative signals cpoutip, cpoutim from the first output of the integral CP path 222, and the other data input II2 is connected to receive the alternating negative and positive signals cpoutim,cpoutip output from the second output of the integral CP path 222. The inputs II1 and II2 are alternatively switched between outputs IO1 and IO2 in response to the control signal fref/2 received at the control input C. Accordingly, signals applied at input II1 will be alternatively sent to outputs IO1 and IO2 in successive clock cycles, and the signals applied at input II2 will be output alternatively at outputs IO1 and IO2. In this regard, FIG. 11 shows alternating positive and negative integral CP path output signals cpoutip(1); cpoutim(2); . . . ; cpoutip(n) fed to input II1 and alternating negative and positive integral CP path output signals cpoutim(1); cpoutip(2); . . . ; cpoutim(n), with the annotation numbers in parenthesis representing successive samples that correspond to clock cycles applied at the control input C. As seen in FIG. 11, the chopper output IO1 generates output signal cpoutip(1); cpoutip(2); . . . ; cpoutip(n) that includes the positive charge pumped integral path signals, and chopper output IO2 generates an output signal cpoutim(1); cpoutim(2); . . . ; cpoutim(n) that includes the negative charge pumped integral path signals.

Similarly, the signals output from proportional CP path 224 are applied to proportional path chopper circuit 824 where they are down converted and the resulting charge-pumped baseband signals cpoutpp and cpoutpm are fed as inputs to active loop filter 230. FIG. 11 illustrates the operation of proportional path chopper circuit 824 in greater detail, which processes the outputs from proportional CP path 224 in the same manner that integral path chopper circuit 822 processes the outputs from integral CP path 222.

In at least some examples, the current noise introduced at the charge pump 220A will be modulated to the chopper frequency in the output signals cpoutip, cpoutim, cpoutpp and cpoutpm such that the noise will be filtered out by the low-pass filtering that is inherent in the PLL circuit 200. By way of further explanation, a PLL transfer function derivation can be represented by the following equations:

Modulate Input Signal:

$$nt(t) = 2 \sum_{k=1}^{\infty} \frac{\sin\left(\frac{k\pi}{2}\right)}{\left(\frac{k\pi}{2}\right)} \cos(2\pi f_{chop} k t). \tag{10}$$

Demodulate Input Signal:

$$v_a(t) = \tag{11}$$

$$4 A V_m(t) \sum_{k=1}^{\infty} \frac{\sin\left(\frac{k\pi}{2}\right)}{\left(\frac{k\pi}{2}\right)} \cos(2\pi f_{chop} k t) \sum_{l=1}^{\infty} \frac{\sin\left(\frac{l\pi}{2}\right)}{\left(\frac{l\pi}{2}\right)} \cos(2\pi f_{chop} l t)$$

Modulate Noise:

$$S_{cs}(f) = \tag{12}$$

$$\sum_{k=-\infty}^{\infty} |M_{2k+1}|^2 S_N\left(f - \frac{2k+1}{T}\right) = \left(\frac{2}{\pi}\right)^2 \sum_{k=-\infty}^{\infty} \frac{1}{(2k+1)^2} S_N\left(f - \frac{2k+1}{T}\right)$$

Figure 12:
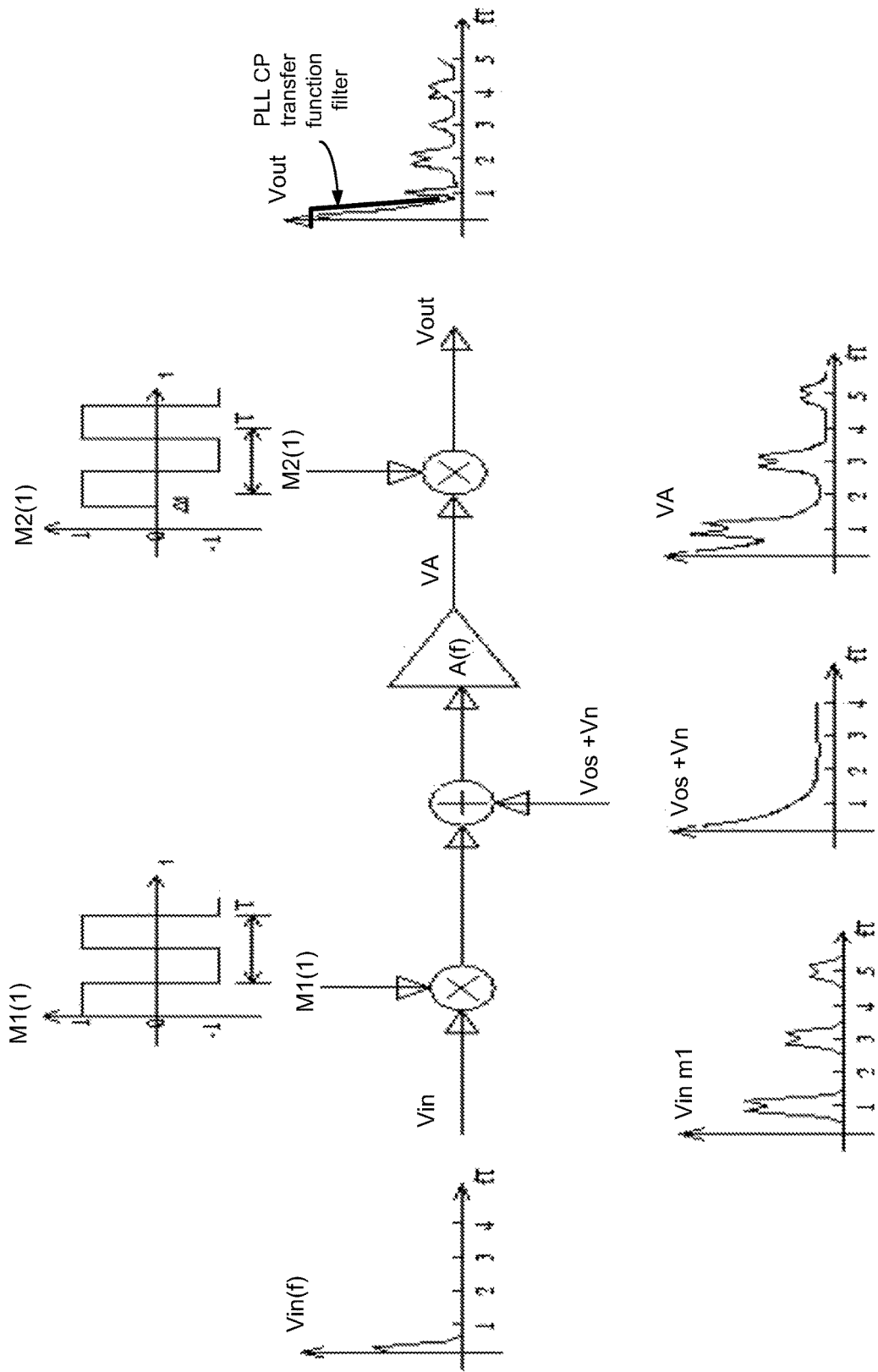
FIG. 12 represents the chopping and flicker noise filtering operations of a PLL that incorporates chopping operations.

FIG. 12 illustrates a chopping and filtering operation performed by a chopper enabled charge pump circuit such as charge pump 220A. As shown in FIG. 12, the input signal from the PFD is up-converted at an initial chopper circuit (chopper circuit 802 for example) before charge pumping, and then subsequently down-converted by a post-charge pump chopper circuit (chopper circuits 822, 824 for example). The input signal spectrum is retained through the up-conversion and down-conversion operations because the down-conversion negates the effect of the up-conversion operation on the input signal. However, the charge pump flicker noise and offset "Vos+Vn" that are added by the charge pump after the initial chopper circuit are only subjected to the post-charge pump chopper circuit, with the result that the charge pump flicker noise and offset "Vos+Vn" only pass through one chopping operation and there for are only up-converted. After the post-charge pump chopper circuit, the charge pump flicker noise and offset "Vos+Vn" is up-converted to a frequency that is much higher than the PLL upper corner frequency. The PLL transfer function derivation corresponds to a low pass filter for integral charge pump and bandpass filter for proportional charge pump. For either filter the high cut off frequency is much smaller than the chopping frequency, which allows for filtering of unwanted charge pump noise and chopping clock feed-through spur.

Accordingly, in at least some examples, chopping can be performed in the charge pump to provide PLL noise reduction in a space and cost efficient manner, which may improve clocking performance in high speed ADC applications, optical applications and other applications. In at least some example embodiments, the components of charge pump circuit 220A can be formed along with all of the other components of PLL 200 in a single integrated circuit, on-die PLL solution.

Although described above in the context of a charge pump having integral and proportional CP paths, the chopper circuit design described above could also be applied in the context of other differential charge pump circuit designs, including for example a differential charge pump such as that described above in passive mode PLL design of FIG. 1.

FIG. 13 shows a method 1300 that can be applied in at least some example embodiments to charge pump signals. In the illustrated example, at an intake chopper 802, successive input signals (upp,m) received at a first input I1 are switched alternatively between first and second outputs O1, O2 in successive cycles of a chopping frequency (fref/2) and successive input signals (dnp,m) at a second input I2 are switched alternatively between the second and first outputs O2, O1 in the successive cycles (step 1302). The signals output from the first and second outputs O1, O2 are then charge pumped at charge pump 220 to produce corresponding first and second charge pumped signals (step 1304). At an output chopper, the first and second charge pumped signals are received at respective first and second inputs, which output the first charge pumped signals alternatively at first and second outputs in successive cycles of the chopping frequency, and output the second charge pumped signals alternatively at the second and first outputs in successive cycles of the chopping frequency (step 1306).

In an example embodiment where the charge pump includes both integral and proportional charge pump paths, step 1304 is performed as two parallel steps, namely step 1304A that includes using integral charge pump path 222 to receive signals (upp,m, dnp,m) from the first and second outputs O1, O2 of the intake chopper circuit 802 and output corresponding first and second integral charge pumped signals (cpoutip,m and cpoutim,p) and step 1304 B that includes using proportional charge pump path 224 to receive signals (upp,m, dnp,m) from the first and second outputs O1, O2 of the intake chopper circuit 802 and output corresponding first and second proportional charge pumped signals (cpoutpp,m and cpoutpm,p).

Similarly, the step 1306 includes two parallel chopper processes, namely: step 1306A that includes using integral path chopper circuit 822 to switch the first and second integral charge pumped signals (cpoutip,m and cpoutim,p) between first and second integral path chopping circuit outputs IO1, IO2 at the chopping frequency; and step 1306B that includes using proportional path chopper circuit 824 to switch the first and second proportional charge pumped signals (cpoutpp,m and cpoutip,p) between first and second proportional path chopping circuit outputs at the chopping frequency.

In example embodiments, the method step 1306A results in successive positive integral charge pumped signals (cpoutip) output at integral chopper circuit first output IO1, successive negative integral charge pumped signals (cpoutim) at integral chopper circuit second output IO2, successive positive proportional charge pumped signals (cpoutpp) at a proportional chopper circuit first output PO1 and successive negative proportional charge pumped signals (cpoutpm) at proportional chopper circuit second output PO2.

In example embodiments, the chopping frequency is greater than a corner frequency of current noise introduced by the integral and proportional charge pump paths.

Figure 14:
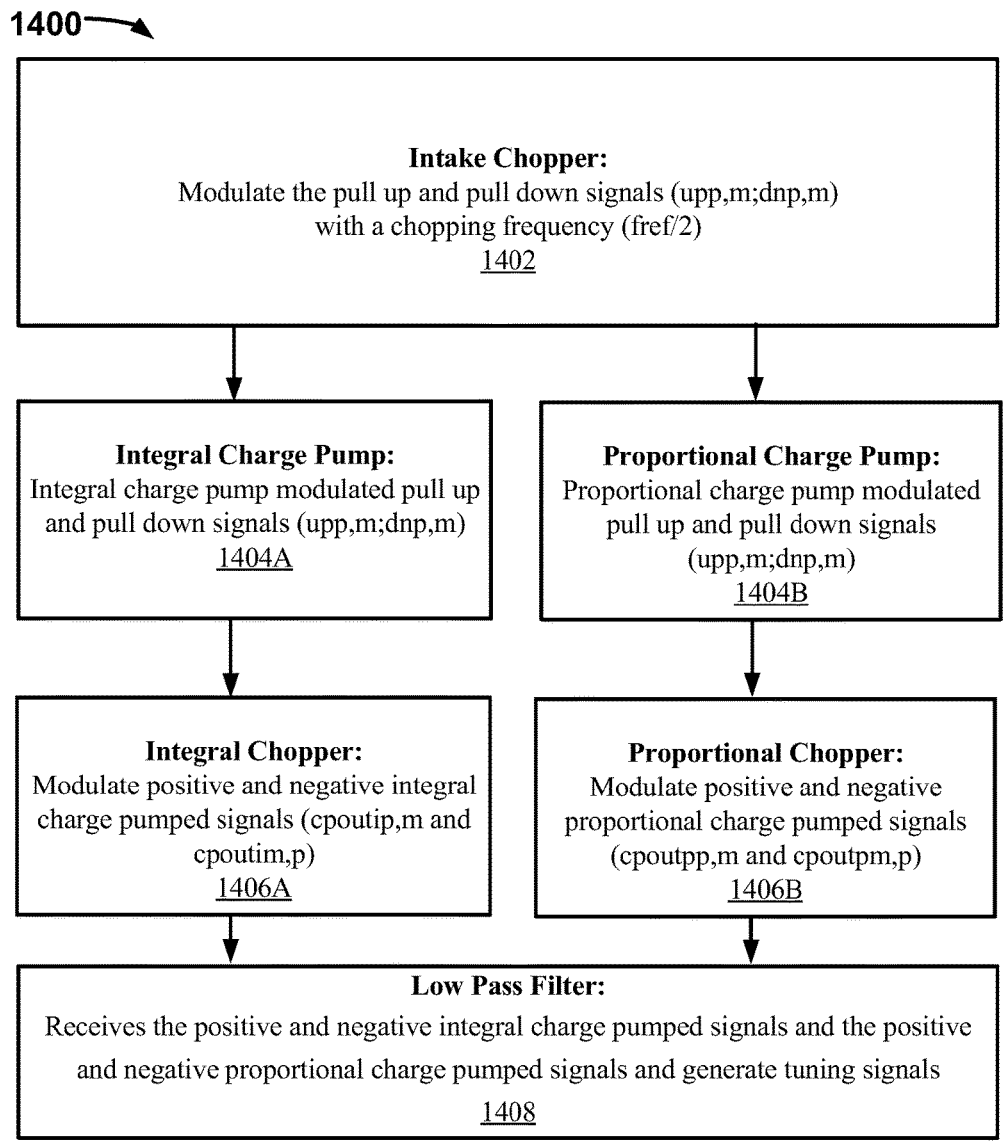
FIG. 14 illustrates an example embodiment of a method of controlling a PLL.

FIG. 14 illustrates an example embodiment of a method 1400 of controlling a PLL according to example embodiments. In the example of FIG. 14, the PLL has an active low pass filter 230 configured to generate one or more tuning signals (vcotunep, vcotunem); a voltage-controlled oscillator (VCO) 240 coupled to the active low pass filter and configured to generate a feedback signal (feedbkclkin) based on the one or more tuning signals; and a phase frequency detector 210 configured to compare the feedback signal to a reference signal and generate pull up and pull down signals (upp,m; dnp,m) based on the comparison. The method 1400 includes: modulating, using a first chopper circuit 802, the pull up and pull down signals (upp,m; dnp,m) with a chopping frequency (fref/2) (step 1402). The modulated pull up and pull down signals are then processed in parallel with an integral path and a proportional path. On integral path, the modulated pull up and pull down signals (upp,m; dnp,m) are charge pumped using an integral charge pump path 222, to output corresponding positive and negative integral charge pumped signals (cpoutip,m and cpoutim,p) (step 1404A), which are then modulated with the chopping frequency(fref/2), using an integral path chopper circuit 822 (step 1406A). Similarly, on proportional path, the modulated pull up and pull down signals (upp,m; dnp,m) are charge pumped using a proportional charge pump path 224, to output corresponding positive and negative integral charge pumped signals (cpoutpp,m and cpoutpm,p) (step 1404B), which are then modulated with the chopping frequency(fref/2), using an proportional path chopper circuit 824 (step 1406B). As indicated at step 1408, the active low pass filter 230 receives the positive and negative integral charge pumped signals from the integral path chopper circuit 822 and the positive and negative proportional charge pumped signals from the proportional path chopper circuit 324, and generates the one or more tuning signals based thereon.

In some examples, modulating, using the intake chopper circuit 802 in step 1402 includes comprises switching first and second outputs (O1, O2) of the chopper circuit 802 between first and second inputs (I1,I2) at the chopping frequency, wherein successive pull up signals at the first input are output alternatively at the first and second outputs in successive cycles of the chopping frequency and successive pull down signals at the second input are output alternatively at the second and first outputs in successive cycles of the chopping frequency. Furthermore, modulating, using the integral path chopper circuit 822 at step 1506A comprises switching first and second outputs IO1, IO2 of the integral path chopper circuit 822 between first and second inputs II1, II2 of the integral path chopper circuit 822 at the chopping frequency, wherein successive positive and negative integral charge pumped signals at each of the first and second inputs are output alternatively at the first and second outputs with the positive integral charge pumped signals (cpoutip) being successively output exclusively at the first output IO1 and the negative integral charge pumped signals (cpoitim) being successively output exclusively at the second output IO2 in successive cycles of the chopping frequency. Similarly, modulating, using the proportional path chopper circuit 824, comprises switching first and second outputs PO1, PO2 of the proportional path chopper circuit between first and second inputs PI1, PI2 of the proportional path chopper circuit at the chopping frequency, wherein successive positive and negative proportional charge pumped signals at each of the first and second inputs are output alternatively at the first and second outputs with the positive proportional charge pumped signals (cpoutpp) being successively output exclusively at the first output PO1 and the negative proportional charge pumped signals (cpoutm) being successively output exclusively at the second output PO2 in successive cycles of the chopping frequency.

Figure 15:
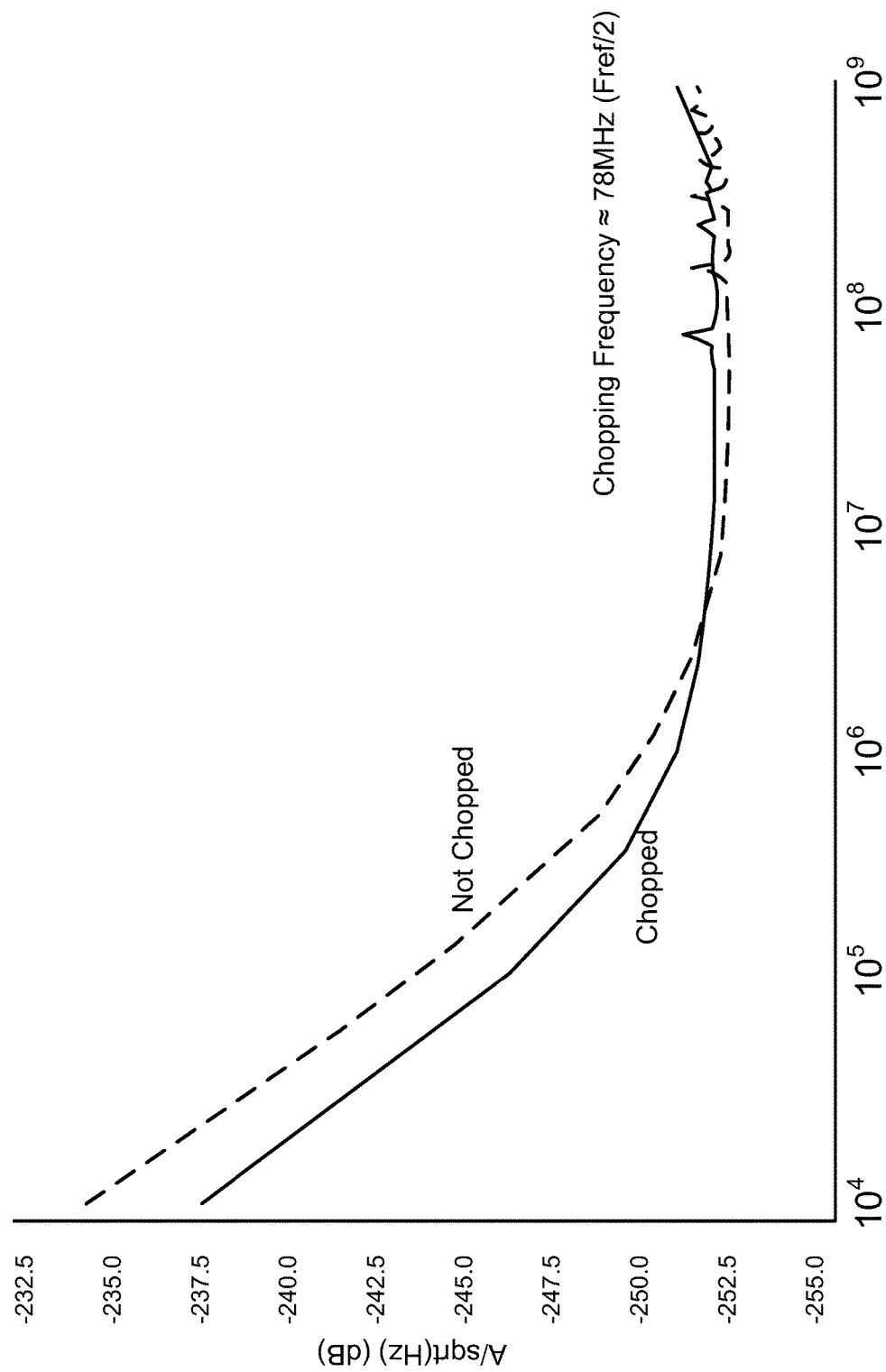
FIG. 15 is a graph showing a comparison of charge pump output current noise with and without chopping.

FIG. 15 is a graph showing a comparison of charge pump output with and without chopping, according to one example. In the example of FIG. 15, around 2-2.5 dB noise improvement occurs at a 100 kHz offset. At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A charge pump circuit comprising:
an intake chopper circuit configured to switch input signals received at the first and second inputs of the intake chopper circuit between first and second outputs of the intake chopper circuit at a chopping frequency, wherein successive input signals at the first input are provided alternatively at the first and second outputs in successive cycles of the chopping frequency and successive input signals at the second input are provided alternatively at the second and first outputs in successive cycles of the chopping frequency;
a differential charge pump configured to receive the signals from the first and second outputs of the intake chopper circuit and produce corresponding first and second charge pumped signals; and
an output chopper circuit configured to receive the first and second charge pumped signals at respective first and second inputs, provide the first charge pumped signals alternatively at first and second outputs in successive cycles of the chopping frequency, and provide the second charge pumped signals alternatively at the second and first outputs in successive cycles of the chopping frequency.

2. The charge pump circuit of claim 1 wherein:
the differential charge pump includes: (i) an integral charge pump path configured to receive signals from the first and second outputs of the intake chopper circuit and provide corresponding first and second integral charge pumped signals as the first and second charge pumped signals; and (ii) a proportional charge pump path configured to receive signals from the first and second outputs of the intake chopper circuit and provide corresponding first and second proportional charge pumped signals;

the output chopper circuit includes: (i) an integral path chopper circuit configured to switch the first and second integral charge pumped signals between first and second integral path chopping circuit outputs at the chopping frequency; and (ii) a proportional path chopper circuit configured to switch the first and second proportional charge pumped signals between first and second proportional path chopping circuit outputs at the chopping frequency.

3. The charge pump circuit of claim 2 wherein in successive cycles of the chopping frequency:

the integral path chopper circuit receives alternating positive and negative integral charge pumped signals at a first input and alternating negative and positive integral charge pumped signals at a second input, and provides successive positive integral charge pumped signals at a first output and provides successive negative integral charge pumped signals at a second output;

the proportional path chopper circuit receives alternating positive and negative proportional charge pumped signals at a first input and alternating negative and positive proportional charge pumped signals at a second input, and provides successive positive proportional charge pumped signals at a first output and provides successive negative proportional charge pumped signals at a second output.

4. The charge pump circuit of claim 2 wherein the intake charge pump, integral charge pump path and proportional charge pump path each comprise a butterfly switch circuit configured to switch a pair of inputs between a pair of outputs at the chopping frequency.

5. The charge pump circuit of claim 2 wherein the proportional charge pump path is an N scaled replica of the integral charge pump path where $10 \leq N \leq 40$.

6. The charge pump circuit of claim 1 wherein:

the first input of the intake chopper circuit receives successive pull-up signals from a phase frequency detector and the second input of the intake chopper circuit receives successive pull-down signals from the phase frequency detector, the first and second outputs of the intake chopper circuit providing first and second output signals that each comprise alternating pull-up and pull-down signals.

7. The charge pump circuit of claim 1 wherein the output chopper circuit up-converts flicker noise introduced by the differential charge pump path to the chopping frequency, the chopping frequency being selected to exceed a corner frequency of the flicker noise.

8. A method of applying charge pumping signals, comprising:

at an intake chopper, switching successive input signals received at a first input alternatively between first and second outputs in successive cycles of a chopping frequency and switching successive input signals at a second input alternatively between the second and first outputs in the successive cycles;

charge pumping the signals output from the first and second outputs to produce corresponding first and second charge pumped signals; and at an output chopper, receiving the first and second charge pumped signals at respective first and second inputs, providing the first charge pumped signals alternatively at first and second outputs in successive cycles of the chopping frequency, and providing the second charge pumped signals alternatively at the second and first outputs in successive cycles of the chopping frequency.

9. The method of claim 8, wherein:

the charge pumping includes: (i) using an integral charge pump path to receive signals from the first and second outputs of the intake chopper circuit and provide corresponding first and second integral charge pumped signals as the first and second charge pumped signals; and (ii) using a proportional charge pump path to receive the signals from the first and second outputs of the intake chopper circuit and provide corresponding first and second proportional charge pumped signals; and the receiving and outputting at the output chopper comprises: (i) using an integral path chopper circuit to switch the first and second integral charge pumped signals between first and second integral path chopping circuit outputs at the chopping frequency; and (ii) using a proportional path chopper circuit to switch the first and second proportional charge pumped signals between first and second proportional path chopping circuit outputs at the chopping frequency.

10. The method of claim 9 wherein in successive cycles of the chopping frequency:

the integral path chopper circuit receives alternating positive and negative integral charge pumped signals at a first input and alternating negative and positive integral charge pumped signals at a second input, and outputs successive positive integral charge pumped signals at a first output and outputs successive negative integral charge pumped signals at a second output;

the proportional path chopper circuit receives alternating positive and negative proportional charge pumped signals at a first input and alternating negative and positive proportional charge pumped signals at a second input, and outputs successive positive proportional charge pumped signals at a first output and outputs successive negative proportional charge pumped signals at a second output.

11. The method of claim 8 wherein:

the first input of the intake chopper receives successive pull-up signals from a phase frequency detector and the second input of the intake chopper receives successive pull-down signals from the phase frequency detector, the first and second outputs of the intake chopper providing first and second output signals that each comprise alternating pull-up and pull-down signals.

12. The method of claim 8 wherein the switching at the intake chopper up-converts the input signals to the chopping frequency, and the switching at the output chopper: (i) down-converts a spectrum of the first and second charge pumped signals corresponding to the spectrum of the input signals from the chopping frequency; and (ii) up-converts flicker noise introduced by the charge pumping to the chopping frequency.

13. A phase lock loop (PLL) comprising:

an active low pass filter configured to generate one or more tuning signals;

a voltage-controlled oscillator (VCO) coupled to the active low pass filter and configured to generate a feedback signal based on the one or more tuning signals;

a phase frequency detector configured to compare the feedback signal to a reference signal and generate pull up and pull down signals based on the comparison; and a charge pump circuit comprising:
an intake chopper circuit configured to modulate the pull up and pull down signals with a chopping frequency;
an integral charge pump path configured to receive the modulated pull up and pull down signals and output corresponding positive and negative integral charge pumped signals;
an integral path chopper circuit configured to modulate the positive and negative integral charge pumped signals at the chopping frequency;
a proportional charge pump path configured to receive the modulated pull up and pull down signals and output corresponding positive and negative proportional charge pumped signals; and
a proportional path chopper circuit configured to modulate the positive and negative proportional charge pumped signals at the chopping frequency,
wherein the active low pass filter is coupled to the charge pump circuit to receive the positive and negative integral charge pumped signals and the positive and negative proportional charge pumped signals and configured to generate the one or more tuning signals based thereon.

14. The PLL of claim 13 wherein the intake chopper circuit is configured to switch first and second chopper circuit outputs between first and second chopper circuit inputs at the chopping frequency, wherein successive pull up signals at the intake chopper circuit input are output alternatively at the first and second chopper circuit outputs in successive cycles of the chopping frequency and successive pull down signals at the second chopper circuit input are output alternatively at the second and intake chopper circuit outputs in successive cycles of the chopping frequency.

15. The PLL of claim 14 wherein:
the integral path chopper circuit includes first and second inputs and first and second outputs and is configured to switch the first and second outputs between the first and second inputs at the chopping frequency, wherein successive positive and negative integral charge pumped signals at each of the first and second inputs are output alternatively at the first and second outputs with the positive integral charge pumped signals being successively output exclusively at the first output and the negative integral charge pumped signals being successively output exclusively at the second output in successive cycles of the chopping frequency; and
the proportional path chopper circuit includes first and second inputs and first and second outputs and is configured to switch the first and second outputs between the first and second inputs at the chopping frequency, wherein successive positive and negative proportional charge pumped signals at each of the first and second inputs are output alternatively at the first and second outputs with the positive proportional charge pumped signals being successively output exclusively at the first output and the negative proportional charge pumped signals being successively output exclusively at the second output in successive cycles of the chopping frequency.

16. The PLL of claim 13 wherein the chopping frequency is greater than a corner frequency of current noise introduced by the integral and proportional charge pump paths.

17. The PLL of claim 13 wherein the proportional charge pump path is an N scaled replica of the integral charge pump path where $10<=N<=40$.

18. A method of controlling a phase lock loop (PLL) having an active low pass filter configured to generate one or more tuning signals; a voltage-controlled oscillator (VCO) coupled to the active low pass filter and configured to generate a feedback signal based on the one or more tuning signals; a phase frequency detector configured to compare the feedback signal to a reference signal and generate pull up and pull down signals based on the comparison,
the method comprising:
modulating, using an intake chopper circuit, the pull up and pull down signals with a chopping frequency;
charge pumping, using an integral charge pump path, the modulated pull up and pull down signals to output corresponding positive and negative integral charge pumped signals;
modulating, using an integral path chopper circuit, the positive and negative integral charge pumped signals with the chopping frequency;
charge pumping, using a proportional charge pump path, the modulated pull up and pull down signals and output corresponding positive and negative proportional charge pumped signals;
modulating, using a proportional path chopping circuit, the positive and negative proportional charge pumped signals with the chopping frequency,
receiving, at the active low pass filter, the positive and negative integral charge pumped signals from the integral path chopper circuit and the positive and negative proportional charge pumped signals from the proportional path chopper circuit, and generating the one or more tuning signals based thereon.

19. The method of claim 18 wherein modulating, using the intake chopper circuit, comprises switching first and second outputs of the intake chopper circuit between first and second inputs of the intake chopper circuit at the chopping frequency, wherein successive pull up signals at the first input are output alternatively at the first and second outputs in successive cycles of the chopping frequency and successive pull down signals at the second input are output alternatively at the second and first outputs in successive cycles of the chopping frequency.

20. The method of claim 19 wherein:
modulating, using the integral path chopper circuit, comprises switching first and second outputs of the integral path chopper circuit between first and second inputs of the integral path chopper circuit at the chopping frequency, wherein successive positive and negative integral charge pumped signals at each of the first and second inputs are output alternatively at the first and second outputs with the positive integral charge pumped signals being successively output exclusively at the first output and the negative integral charge pumped signals being successively output exclusively at the second output in successive cycles of the chopping frequency; and
modulating, using the proportional path chopper circuit, comprises switching first and second outputs of the proportional path chopper circuit between first and second inputs of the proportional path chopper circuit at the chopping frequency, wherein successive positive and negative proportional charge pumped signals at each of the first and second inputs are output alternatively at the first and second outputs with the positive proportional charge pumped signals being successively output exclusively at the first output and the negative proportional charge pumped signals being successively output exclusively at the second output in successive cycles of the chopping frequency.

* * * * *